US010538839B2

(12) United States Patent
Lee et al.

(10) Patent No.: US 10,538,839 B2
(45) Date of Patent: Jan. 21, 2020

(54) METHOD FOR MANUFACTURING METAL OR METAL OXIDE POROUS THIN FILMS HAVING A THREE-DIMENSIONAL OPEN NETWORK STRUCTURE THROUGH PORE SIZE ADJUSTMENT IN A DRY PROCESS, AND FILMS MANUFACTURED BY SAID METHOD

(71) Applicant: KOREA INSTITUTE OF INDUSTRIAL TECHNOLOGY, Cheonan-si, Chungcheongname-do (KR)

(72) Inventors: Ho Nyun Lee, Incheon (KR); Hyun Jong Kim, Seoul (KR)

(73) Assignee: Korea Institute of Industrial Technology, Cheonan-si, Chungcheongnam-do (KR)

( * ) Notice: Subject to any disclaimer, the term of this patent is extended or adjusted under 35 U.S.C. 154(b) by 345 days.

(21) Appl. No.: 15/511,240

(22) PCT Filed: Sep. 14, 2015

(86) PCT No.: PCT/KR2015/009620
§ 371 (c)(1),
(2) Date: May 18, 2017

(87) PCT Pub. No.: WO2016/043481
PCT Pub. Date: Mar. 24, 2016

(65) Prior Publication Data
US 2019/0153585 A1    May 23, 2019

(30) Foreign Application Priority Data

Sep. 15, 2014  (KR) .......................... 10-2014-0122125
Sep. 16, 2014  (KR) .......................... 10-2014-0122673

(51) Int. Cl.
*C23C 14/24*  (2006.01)
*C23C 14/14*  (2006.01)
(Continued)

(52) U.S. Cl.
CPC .......... *C23C 14/08* (2013.01); *C23C 14/0021* (2013.01); *C23C 14/14* (2013.01); *C23C 14/24* (2013.01); *C23C 14/5806* (2013.01)

(58) Field of Classification Search
CPC ......... C23C 14/08; C23C 14/14; C23C 14/24; C23C 14/58
See application file for complete search history.

(56) References Cited

U.S. PATENT DOCUMENTS 5,084,179 A * 1/1992 Knight ................... B01D 69/02
                                                    210/500.38
8,178,447 B1 * 5/2012 Fan ...................... H01L 51/0525
                                                    257/E21.24
(Continued)

FOREIGN PATENT DOCUMENTS

KR    10-2011-0115798 A    10/2011
KR    10-2013-0023011 A    3/2013
KR    10-2014-0067193 A    6/2014

OTHER PUBLICATIONS

Tesfamichael, T., et al., "Development of porous metal oxide thin films be co-evaporation". Applied Surface Science 253 (2007) 4853-4859.*

(Continued)

*Primary Examiner* — Bret P Chen
(74) *Attorney, Agent, or Firm* — Rabin & Berdo, P.C.

(57) ABSTRACT

A method for manufacturing a metal or metal oxide porous thin film having a three-dimensional open-network structure by controlling its pore size through a dry process is provided. The film can be used in a gas sensor, a biosensor, a (Continued)

battery capacitor, a fuel cell, a solar cell, a chemical catalyst, or an antibacterial filter.

13 Claims, 15 Drawing Sheets

(51) Int. Cl.
  *C23C 14/08* (2006.01)
  *C23C 14/00* (2006.01)
  *C23C 14/58* (2006.01)

(56) References Cited

U.S. PATENT DOCUMENTS

| | | | | | |
|---|---|---|---|---|---|
| 2007/0105239 | A1* | 5/2007 | Lee | | B01L 3/502707 438/1 |
| 2007/0224410 | A1* | 9/2007 | Katsir | | H01G 9/0032 428/312.2 |
| 2008/0038934 | A1* | 2/2008 | Vrtis | | H01L 21/02115 438/759 |
| 2008/0248189 | A1* | 10/2008 | Ohtsuka | | H01M 4/0423 427/58 |
| 2010/0239749 | A1* | 9/2010 | Yoshida | | H05K 3/1208 427/97.3 |
| 2011/0008531 | A1* | 1/2011 | Mikhaylik | | H01M 4/04 427/77 |
| 2011/0248315 | A1* | 10/2011 | Nam | | B82Y 10/00 257/184 |
| 2012/0125850 | A1* | 5/2012 | Fujimura | | B01D 69/082 210/650 |
| 2014/0227548 | A1* | 8/2014 | Myrick | | C06B 45/30 428/570 |
| 2016/0104888 | A1* | 4/2016 | Li et al. | | H01M 4/525 429/188 |

OTHER PUBLICATIONS

Betard, Angelique, et al., "Metal-Organic Framework Thin Films: From Fundamentals to Applications." Chemical Reviews, 2012, 112, 1055-1083.*

McClelland, Matthew A., et al., "Material and Energy Flow in a Metal Evaporation System with Moving Boundaries". Ind. Eng. Chem. Res. 2004, 43, 3948-3956.*

Safarian, Jafar, et al., "Vacuum Evaporation of Pure Metals". Metallurgical and Materials Transactions A, vol. 44A, Feb. 2013, pp. 747-753.*

Chen, Chen, et al., "Control of evaporation by geometry in capillary structures. From confined pillar arrays in a gap radial gradient to phyllotaxy-inspires geometry". Scientific Reports, 7:15110; Nov. 8, 2017, pp. 1-8.*

International Search Report for PCT/KR2015/009620 dated Nov. 17, 2015 from Korean Intellectual Property Office.

Gustaf J. Lindquist et al., "Porous particulate film deposition in the transition regime", Journal of Aerosol Science, Apr. 12, 2014, vol. 74, pp. 42-51.

Pyun, Yeong Mi et al., "Humidity-Sensitive Characteristics of $MgCr_2O_4$-based Thin-Film Humidity Sensors", Journal of the Korean Ceramic Society: Jun. 30, 2000, vol. 37, No. 6, pp. 537-544.

Lee, Yun Ho et al., "Research on Multi-Component Electrodes Fabrication for Solid Oxide Fuel Cell using Co-Sputtering Method", Proceedings of KSPE Autumn Conference: Oct. 31, 2011, pp. 613-614.

* cited by examiner

Cross-section

Surface

Nitrogen adsorption and desorption curve pore distribution

Nitrogen adsorption and desorption curve pore distribution

Cross-section surface

METHOD FOR MANUFACTURING METAL OR METAL OXIDE POROUS THIN FILMS HAVING A THREE-DIMENSIONAL OPEN NETWORK STRUCTURE THROUGH PORE SIZE ADJUSTMENT IN A DRY PROCESS, AND FILMS MANUFACTURED BY SAID METHOD

BACKGROUND OF THE INVENTION

Field of the invention

The present invention relates to a metal or metal oxide porous thin film having a three-dimensional open-network structure, which is used for a gas sensor, a biosensor, a battery-capacitor, a fuel cell, a solar cell, a chemical catalyst, an antibacterial filter, etc., and, more particularly, to a metal or metal oxide porous thin film having a three-dimensional open-network structure, which is manufactured through a dry process instead of a wet process and has mesopores, and a method for manufacturing the same.

Related Art

A porous thin film is used for a gas sensor, a biosensor, a solar cell, a secondary battery, a fuel cell, an environmental filter, a catalyst, etc. The porous thin film used at present is manufactured by a wet process such as a sol-gel method, a template method, a coating method.

In a gas detection sensor, when a gas contacts the surface of an oxide semiconductor, which is the main constituting element of a gas detection electrode, a change occurs in the thickness of the depletion layer of the surface and the change in the electric conductivity occurring therefrom is measured and the concentration of the gas is detected. The gas sensor market (including the biosensor market) is currently rapidly expanding from 13 billion US dollars in 2012 to 26 billion US dollars in 2019 (BCC Research (2013.04, www.bccresearch.com)) and the domestic gas market in Korea is expected to continuously grow on a steady pace from 60 billion Korean Won in 2009 to 140 billion Korean Won in 2019 by an annual growth rate of 7.2%.

A sol-gel method is a method for forming pores by an alkyl group, which is a metal ligand, and evaporation of a solvent. The method can only form oxides and has disadvantages in that it is difficult to control pore distribution and a long-term drying is required for obtaining a uniform membrane without a crack. Additionally, the method requires heat treatment to improve crystallinity, during which the porosity is decreased while increasing particle size.

A template method is a method where a template is inserted during the manufacture of a thin film and pores are formed by removing the template, and in general, pores are formed by a sol-gel method or coating method. The template method has an advantage in that it enables the realization of a regular pore structure but the method has a problem in that it requires high-temperature heat treatment or acid treatment to remove the template. Additionally, the method has a disadvantage in that the processing cost is increased because it is impossible to recover the template.

A particle coating method is a method for forming pores using the space between the original pores of particles and the particles themselves. The method has an advantage in that it is possible to control pore distribution according to the porosity and size of pores, but the method also has problems in that it requires the use of a binder and a solvent, requires heat treatment for their removal after the manufacture of the film, and also porosity is decreased because the particles grow and bind during the heat treatment. In the conventional method of manufacturing the porous thin film, a template method is a method where a template is inserted during the manufacture of a thin film and pores are formed by removing the template, and in general, pores are formed by a sol-gel method or coating method. The template method has an advantage in that it enables the realization of a regular pore structure but the method has a problem in that it requires high-temperature heat treatment or acid treatment to remove the template. Additionally, the method has a disadvantage in that the processing cost is increased because it is impossible to recover the template.

That is, the wet processes as described above essentially require a heat treatment process and subsequently there is an inevitable problem of loss of pores due to heat treatment. As a technology to manufacture a porous thin film by a dry process to replace the wet process, Korean Patent Application Publication No. 10-2013-0023011 discloses a method for fabricating a porous thin film which includes forming a thin film from two or more elements followed by selectively removing particular elements using a dry lithography, and a porous thin film structure manufactured therefrom. According to the above technology, the entire process of manufacturing the porous thin film structure consists of only a dry process and it thus has advantages in that the method is simpler in terms of procedural management compared to a case when a wet process such as the conventional electrode-position method or selective dissolution method, etc., has a less burden with regard to the environment, and a large-scale production is possible. Additionally, the above technology not only enables an easy control of porosity but also maintains a constant porosity and thus a mesoporous thin film structure that exhibits a reproducible sensitivity can be manufactured when it is used as a sensor. However, the procedure had problems in that it is complex because the procedure includes a process of selectively removing elements thus increasing the manufacturing cost, the pore uniformity does not meet the required standard, and the range of controlling porosity is narrow.

SUMMARY OF INVENTION

As described above, the conventional wet processes essentially require a heat treatment process, and essentially accompany the problem of loss of pores by the heat treatment.

The present invention employs a dry process not necessitating a heat treatment instead of a wet process, and provides a method for manufacturing a metal or metal oxide porous thin film having a three-dimensional open-network structure using a metal or metal oxide, and a metal or metal oxide porous thin film having a three-dimensional open-network structure manufactured using the method.

The present invention relates to a metal or metal oxide porous thin film having a three-dimensional open-network structure used for a gas sensor, a biosensor, a battery-capacitor, a fuel cell, a solar cell, a chemical catalyst, an antibacterial filter, etc., and provides a method for manufacturing a metal porous thin film having a three-dimensional open-network structure by controlling its pore size in a dry process, in which, for controlling the pore structure by controlling the kinetic energy of the evaporated metal vapor, the pressure in a step for providing a constant pressure by injecting an inert gas into the chamber in a vacuum state is controlled in the range of 0.05 Torr to 10 Torr; and in which, in a step for depositing the evaporated metal vapor on top of the substrate, the temperature of the substrate is maintained at the same temperature with a temperature deviation of ±5°

C. within the temperature of 50° C. or below; and in which, in a step for depositing the evaporated metal vapor on top of the substrate, the deposition rate is in the range of 0.1 μm/min to 5 μm/min; and a metal oxide porous thin film having a three-dimensional open-network structure by controlling its pore size, in which, in the metal oxide porous thin film having an open-network structure, the film has a network structure in which nanowires or nanoparticles, which are comprised of metal oxides, are three-dimensionally connected, and comprises mesopores having a diameter of 1.0 nm to 100 nm; and the porous thin film is deposited at the deposition rate of 0.2 μm/min to 5 μm/min, so as to form a three-dimensional open-network porous structure and control the pore structure by controlling the kinetic energy of an evaporated metal or metal oxide vapor thereby minimizing the energy when they arrive at a substrate in an oxide state.

Advantageous Effects of Invention

As described above, the conventional wet processes essentially require a heat treatment process, and thus there is a problem of pore loss due to the heat treatment occurs. That is, although a wet process has a large initial surface area but the surface area is reduced during the drying/sintering process. This is because blocked pores are formed or pores disappear due to the material diffusion and binding between nanoparticles that occur during the heat treatment process. The present invention provides a method for manufacturing a metal porous thin film having a three-dimensional open-network structure in a dry process not necessitating heat treatment in order to replace the wet process described above. Additionally, a wet process has problems in that, due to its characteristic feature, a large amount of chemical wastes are released, the procedure is sophisticated, has a high percentage of defective products, and it is difficult to carry out a large-scale production. The dry process of the present invention provides a metal or metal oxide porous thin film having a three-dimensional open-network structure, which can solve the problems of the wet process described above and also include mesopores.

In particular, in the case of applying Ag as a metal element, the surface area was about 10.2 $m^2/g$ and a metal porous thin film having a three-dimensional open-network structure, in which mesopores having a pore size in the range of 1.0 nm to 100 nm were uniformly distributed, was obtained. The pore structure consisting of three-dimensionally connected nanowire network of the present invention can provide more open pores than pores formed with faces and can thus increase the reactivity of gas sensors, biosensors, solar cells, secondary cells, fuel cells, environmental filters, catalysts, etc.

In particular, in the case of tin oxide as a metal oxide, a metal oxide porous thin film having a three-dimensional open-network structure, in which the surface area is about 72.2 $m^2/g$ and mesopores having a pore size in the range of 1.0 nm to 100 nm were uniformly distributed, was obtained.

The pore structure consisting of three-dimensionally connected nanowire network of the present invention can provide more open pores than pores formed with faces and can thus increase the reactivity of gas sensors, biosensors, solar cells, secondary cells, fuel cells, environmental filters, catalysts, etc.

Additionally, the porous thin film of the present invention has advantages in that it can copy the ciliary structures of animals and can thus embody the technologies of electrochemical control of electrode structure and surface treatment at high speed and low temperature, and form a three-dimensional open structure so that a subject gas for detection can smoothly penetrate into the inside of the electrode and react therein.

BEST MODE FOR CARRYING OUT THE INVENTION

Figure 1:
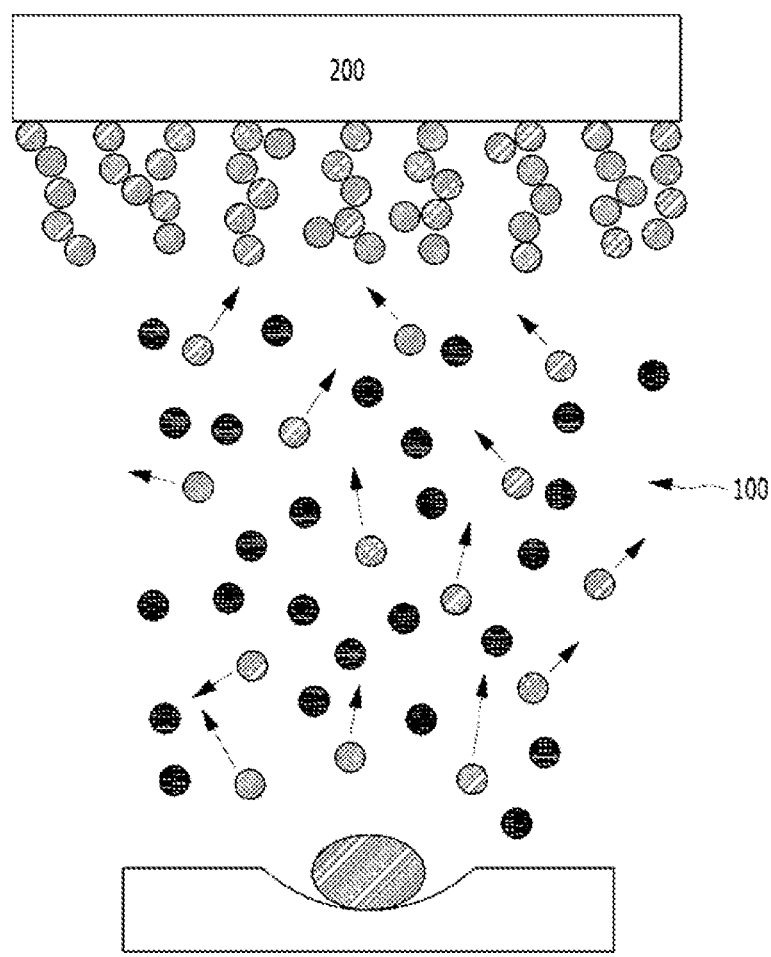
FIG. 1 shows a diagram illustrating the method for manufacturing the metal or metal oxide porous thin film having a three-dimensional open-network structure of the present invention.

The present invention provides a method for manufacturing a metal porous thin film having a three-dimensional open-network structure by controlling its pore size in a dry process, in which the method of manufacturing a metal porous thin film having a three-dimensional open-network structure includes: fixing a substrate 200 to a metal porous thin film having a three-dimensional open-network structure deposition chamber 100 and providing a vacuum state (s100); injecting an inert gas into the chamber 100 in a vacuum state and providing a constant pressure therein (s200); setting the temperature of the substrate at 50° C. or below (s300); increasing the temperature of an evaporation source, in which a metal sample is contained, thereby forming a metal vapor as a thermal evaporation process (s400); and depositing the evaporated metal vapor on top of the substrate (s500); in which, for controlling the pore structure by controlling the kinetic energy of the evaporated metal vapor, the pressure in step (s200) for providing a constant pressure by injecting an inert gas into the chamber in a vacuum state is controlled in the range of 0.05 Torr to 10 Torr; and in which, in step (s500) for depositing the evaporated metal vapor on top of the substrate, the temperature of the substrate is maintained at the same temperature with a temperature deviation of ±5° C. within the temperature of 50° C. or below; and in which, in step (s500) for depositing the evaporated metal vapor on top of the substrate, the deposition rate is in the range of 0.1 μm/min to 5 μm/min.

Additionally, in the method for manufacturing a metal porous thin film having a three-dimensional open-network structure by controlling its pore size in a dry process of the present invention, in which, in step (s200) for providing a constant pressure by injecting an inert gas into the chamber 100 in a vacuum state, the inert gas may be at least one gas selected from the group consisting of Ar, $N_2$, He, Ne, Kr, Xe, and Rn.

Additionally, in the method for manufacturing a metal porous thin film having a three-dimensional open-network structure by controlling its pore size in a dry process of the present invention, in which, in step (s400) for evaporating a metal by constantly heating an evaporation source, in which the metal sample is contained, to the temperature of evaporation or higher, the metal may be at least one selected from the group consisting of Au, Ag, Pd, Al, Cu, Cr, Fe, Mg, Mn, Ni, Ti, Zn, Pb, V, Co, Er, Ca, Ho, Sm, Sc, and Tb.

Additionally, in the method for manufacturing a metal porous thin film having a three-dimensional open-network structure by controlling its pore size in a dry process of the present invention, in which, in step (s400) for evaporating a metal by constantly heating an evaporation source, in which the metal sample is contained, to the temperature of evaporation or higher, the evaporation source may be one selected from the group consisting of a crucible, a coil-type evaporation source, a spiral-type evaporation source using a spiral coil, and a boat-type evaporation source.

Additionally, in the method for manufacturing a metal porous thin film having a three-dimensional open-network structure by controlling its pore size in a dry process of the present invention, in which, the deposition rate may be controlled by controlling the temperature, pressure, temperature of a heat source, and a sample-supplying rate of the substrate.

Additionally, the metal porous thin film having a three-dimensional open-network structure of the present invention may have a surface area of 5 $m^2/g$ to 200 $m^2/g$.

Additionally, the metal porous thin film having a three-dimensional open-network structure by controlling its pore size of the present invention may be characterized in that nanowires or nanoparticles are three-dimensionally connected thereby forming micropores in the form of a network.

Additionally, the micropores of the metal porous thin film having a three-dimensional open-network structure by controlling its pore size of the present invention may include mesopores having a diameter of 1.0 nm to 100 nm.

Additionally, the micropores of the metal porous thin film having a three-dimensional open-network structure by controlling its pore size of the present invention may simultaneously include both mesopores having a diameter of 1.0 nm to 100 nm and macropores having a diameter of 0.5 μm or higher.

Additionally, the thickness of the metal porous thin film having a three-dimensional open-network structure by controlling its pore size of the present invention may be in the range of 0.1 μm to 500 μm.

Additionally, the porous electrode having a three-dimensional open-network structure formed by the metal porous thin film having a three-dimensional open-network structure by controlling its pore size of the present invention, which is used for a gas sensor, a biosensor, a battery-capacitor, a fuel cell, a solar cell, a chemical catalyst, an antibacterial filter, etc., provides a porous electrode having a three-dimensional open-network structure, which has a network structure in which nanowires or nanoparticles are three-dimensionally connected, and includes mesopores having a diameter of 1.0 nm to 100 nm.

Additionally, the porous electrode having a three-dimensional open-network structure formed by the metal porous thin film having a three-dimensional open-network structure by controlling its pore size of the present invention, which is used for a gas sensor, a biosensor, a battery-capacitor, a fuel cell, a solar cell, a chemical catalyst, an antibacterial filter, etc., provides a porous electrode having a three-dimensional open-network structure, which has a network structure in which nanowires or nanoparticles are three-dimensionally connected, and includes mesopores having a diameter of 1.0 nm to 100 nm and macropores having a diameter of 0.5 μm or higher.

Additionally, in the metal or metal oxide porous thin film having a three-dimensional open-network structure by controlling its pore size of the present invention, a metal oxide porous thin film having a three-dimensional open-network structure by controlling its pore size is provided, in which the film has a network structure in which nanowires or nanoparticles, which are comprised of metal oxides, are three-dimensionally connected, and includes mesopores having a diameter of 1.0 nm to 100 nm; and the porous electrode is deposited at the deposition rate of 0.2 μm/min to 5 μm/min, so as to form a three-dimensional open-network porous structure and control the pore structure by controlling the kinetic energy of an evaporated metal or metal oxide vapor thereby minimizing the energy when they arrive at a substrate in an oxide state.

Additionally, in the metal or metal oxide porous thin film having a three-dimensional open-network structure by controlling its pore size of the present invention, a metal oxide porous thin film having a three-dimensional open-network structure by controlling its pore size is provided, in which the film has a network structure in which nanowires or nanoparticles, which are comprised of metal oxides, are three-dimensionally connected, and includes mesopores having a diameter of 1.0 nm to 100 nm and macropores having a diameter of 0.5 μm or higher; and the metal oxide porous thin film having a three-dimensional open-network structure is deposited at the deposition rate of 0.2 μm/min to 5 μm/min, so as to form a porous thin film having a three-dimensional open-network structure and control the pore structure by controlling the kinetic energy of an evaporated metal or metal oxide vapor thereby minimizing the energy when they arrive at a substrate in an oxide state.

Additionally, the metal oxide of the metal oxide porous thin film having a three-dimensional open-network structure by controlling its pore size of the present invention may be at least one selected from the oxides of Sn, Ni, Cu, Ti, V, Cr, Mn, Fe, Co, Zn, Mo, W, Ag, Au, Pt, Ir, Ru, Li, Al, Sb, Bi, Mg, Si, In, and Pd.

Additionally, the metal oxide porous thin film may include any one material selected from W, Mo, and Ta as an evaporation source of the metal oxide porous thin film having a three-dimensional open-network structure by controlling its pore size of the present invention.

Additionally, the present invention provides a method for manufacturing a metal oxide porous thin film having a three-dimensional open-network structure by controlling its pore size in a dry process, in which the method of manufacturing a metal porous thin film having a three-dimensional open-network structure includes: fixing a substrate 200 to a metal oxide porous thin film having a three-dimensional open-network structure deposition chamber 100 and providing a vacuum state (s1000); injecting an inert gas into the chamber 100 in a vacuum state and providing a constant pressure therein (s2000); setting the temperature of the substrate at 50° C. or below (s3000); increasing the temperature of an evaporation source, in which a metal or metal oxide sample is contained, thereby forming a metal or metal oxide vapor as a thermal evaporation process (s4000); and reacting the evaporated metal or metal oxide vapor when oxygen is present in the chamber, whereas depositing the evaporated metal vapor on top of the substrate in an oxide state without reacting when oxygen is absent (s5000); in which, in step (s2000) for injecting an inert gas into the chamber in a vacuum state and providing a constant pressure therein, the oxygen is able replace part or the entirety of the inert gas; for controlling the pore structure by controlling the kinetic energy of the evaporated metal or metal oxide vapor, the pressure in step (s2000) for providing a constant pressure by injecting an inert gas into the chamber in a vacuum state is controlled in the range of 0.1 Torr to 10 Torr; and in which, in step (s5000), where the evaporated metal or metal oxide vapor is reacted when oxygen is present in the chamber, whereas the evaporated metal vapor is not reacted but deposited on top of the substrate in an oxide state when oxygen is absent, the temperature of the substrate is maintained at the same temperature with a temperature deviation of ±5° C. within the temperature of 50° C. or below; in which, in step (s5000), where the evaporated metal or metal oxide vapor is reacted when oxygen is present in the chamber, whereas the evaporated metal vapor is not reacted but deposited on top of the substrate in an oxide state when oxygen is absent, the deposition rate is in the range of 0.2 μm/min to 5 μm/min; and the surface area of the metal oxide thin film being deposited is in the range of 30 m²/g to 600 m²/g.

Additionally, in the method for manufacturing a metal oxide porous thin film having a three-dimensional open-network structure by controlling its pore size of the present invention, in which, in step (s4000) for increasing the temperature of an evaporation source, in which a metal or metal oxide sample is contained, thereby forming a metal or metal oxide vapor so as to form the metal oxide thin film, the metal or metal oxide sample may be at least one selected from the group consisting of metals of Sn, Ni, Cu, Ti, V, Cr, Mn, Fe, Co, Zn, Mo, W, Ag, Au, Pt, Ir, Ru, Li, Al, Sb, Bi, Mg, Si, In, and Pd, and oxides thereof.

Additionally, in the method for manufacturing a metal oxide porous thin film having a three-dimensional open-network structure by controlling its pore size of the present invention, in which, in step (s2000) for injecting an inert gas into the chamber 100 in a vacuum state and providing a constant pressure therein, the inert gas may be at least one gas selected from the group consisting of Ar, $N_2$, He, Ne, Kr, Xe, and Rn.

Additionally, in the method for manufacturing a metal oxide porous thin film having a three-dimensional open-network structure by controlling its pore size of the present invention, in which, the deposition rate may be controlled by controlling the temperature, pressure, temperature of a heat source, and a sample-supplying rate of the substrate.

Additionally, in the method for manufacturing a metal oxide porous thin film having a three-dimensional open-network structure by controlling its pore size of the present invention, in which, in step (s4000) for increasing the temperature of an evaporation source, in which the metal or metal oxide sample is contained, thereby forming a metal or metal oxide vapor, the evaporation source may be one selected from the group consisting of a crucible, a coil-type evaporation source, a spiral-type evaporation source using a spiral coil, and a boat-type evaporation source.

Additionally, in the method for manufacturing a metal oxide porous thin film having a three-dimensional open-network structure by controlling its pore size of the present invention, in which, in step (s4000) for increasing the temperature of an evaporation source, in which the metal or metal oxide sample is contained, thereby forming a metal or metal oxide vapor, the material of the evaporation source may be any one selected from W, Mo, and Ta.

Additionally, the metal oxide porous thin film having a three-dimensional open-network structure by controlling its pore size of the present invention is characterized in that nanowires or nanoparticles are three-dimensionally connected thereby forming micropores in the form of an open-network.

Additionally, the micropores of the metal oxide porous thin film having a three-dimensional open-network structure by controlling its pore size of the present invention may include mesopores having a diameter of 1.0 nm to 100 nm.

Additionally, the micropores of the metal oxide porous thin film having a three-dimensional open-network structure by controlling its pore size of the present invention may simultaneously include both mesopores having a diameter of 1.0 nm to 100 nm and macropores having a diameter of 0.5 μm or higher.

Additionally, the thickness of the metal oxide porous thin film having a three-dimensional open-network structure by controlling its pore size of the present invention may be in the range of 0.1 μm to 500 μm.

DESCRIPTION OF EXEMPLARY EMBODIMENTS

<Metal Porous Thin Film>

The present invention relates to a metal or metal oxide porous thin film having a three-dimensional open-network structure, which is used for a gas sensor, a biosensor, a battery-capacitor, a fuel cell, a solar cell, a chemical catalyst, an antibacterial filter, etc., and, more particularly, to a metal or metal oxide porous thin film having a three-dimensional open-network structure, which is manufactured through a dry process instead of a wet process and has mesopores, and a method for manufacturing the same. The present invention is described in detail with reference to the accompanying drawings herein below. FIG. 1 shows a diagram illustrating the method for manufacturing the metal or metal oxide porous thin film having a three-dimensional open-network structure of the present invention.

In the method for manufacturing a metal porous thin film having a three-dimensional open-network structure, which is used for a gas sensor, a biosensor, a battery-capacitor, a fuel cell, a solar cell, a chemical catalyst, an antibacterial filter, etc., the present invention provides a method for manufacturing a metal porous thin film having a three-dimensional open-network structure by controlling its pore size in a dry process, in which the method of manufacturing a metal porous thin film having a three-dimensional open-network structure includes: fixing a substrate 200 to a metal porous thin film having a three-dimensional open-network structure deposition chamber 100 and providing a vacuum state (s100); injecting an inert gas into the chamber 100 in a vacuum state and providing a constant pressure therein (s200); setting the temperature of the substrate at 50° C. or below (s300); increasing the temperature of an evaporation source, in which a metal sample is contained, thereby forming a metal vapor as a thermal evaporation process (s400); and depositing the evaporated metal vapor on top of the substrate 200 (s500); in which, for controlling the pore structure by controlling the kinetic energy of the evaporated metal vapor, the pressure in step (s200) for providing a constant pressure by injecting an inert gas into the chamber 100 in a vacuum state is controlled in the range of 0.05 Torr to 10 Torr; and in which, in step (s500) for depositing the evaporated metal vapor on top of the substrate 200, the temperature of the substrate 200 is maintained at the same temperature with a temperature deviation of ±5° C. within the temperature of 50° C. or below; and in which, in step (s500) for depositing the evaporated metal vapor on top of the substrate 200, the deposition rate is in the range of 0.1 μm/min to 5 μm/min.

The pressure in step (s200) for providing a constant pressure by injecting an inert gas into the chamber in a vacuum state is in the range of 0.05 Torr to 10 Torr. This is because when the pressure is 0.05 Torr or less it leads to the formation of a dense thin film thus not being able to form a porous thin film, whereas when the pressure is 10 Torr or higher the deposition rate becomes too slow. This can become a cause of a collision between the metal atom being deposited and an inert gas, and in a pressure of 10 Torr or higher, the collision between the metal atom and the inert gas becomes too many thereby significantly deteriorating the deposition rate. In general, with respect to the collision number of the particles, the deposition is expected to be performed without any collision up to 5 cm under a pressure of 1 mTorr. That is, under a pressure of 0.1 Torr or less, the distance that can be proceeded without a collision is 0.05 cm and many collisions will occur before the deposition. The number of collisions determines the degree of tight contact and deposition rate.

In step (s200) for providing a constant pressure by injecting an inert gas into the chamber in a vacuum state to be in the range of 0.05 Torr to 10 Torr, the inert gas is preferably at least one gas selected from the group consisting of Ar, $N_2$, He, Ne, Kr, Xe, and Rn. The inert gas is not limited to the above gases but any gas may be used without limitation as long as the gas does not react with the metal being applied.

In step (s300) for maintaining the temperature of the substrate at the same temperature, the temperature is preferably maintained at 50° C. or below with a temperature deviation of ±5° C. The temperature deviation is a major factor that has an effect on the porosity and particle size of an electrode whose surface is treated in a dry process, and the smaller the temperature deviation the higher the homogeneity. Therefore, the temperature deviation is preferably in the range of ±5° C., and more preferably ±1° C.

In step (s400) for increasing the temperature of an evaporation source, in which a metal sample is contained, thereby forming a metal vapor, the metal may be selected from the group consisting of Au, Ag, Pd, Al, Cu, Cr, Fe, Mg, Mn, Ni, Ti, Zn, Pb, V, Co, Er, Ca, Ho, Sm, Sc, and Tb. In particular, in the case of a material, where the vapor pressure is not significantly lower than the procedural pressure (0.05 Torr to 10 Torr) at a temperature of about 2,400° C. (a limiting temperature) or below, a porous thin film can be formed in most cases. However, in the case of a material which has a melting temperature significantly lower than the temperature of its evaporation source for increasing the vapor pressure, such as Sn, the particle size becomes large due to the conduction of heat generated in the evaporation source thus making it difficult to form a porous thin film.

In step (s400) for increasing the temperature of an evaporation source, in which a metal sample is contained, to a temperature above the temperature of the evaporation point or higher thereby evaporating a metal vapor, the evaporation source is preferably one selected from the group consisting of a crucible, a coil-type evaporation source, a spiral-type evaporation source using a spiral coil, and a boat-type evaporation source, and various other evaporation sources may be applied as well.

In step (s500) for depositing the evaporated metal vapor on top of a substrate, the deposition rate is preferably in the range of 0.1 μm/min to 5 μm/min. In order to secure the economic efficiencies such as the productivity of the dry surface treatment process and manufacturing cost, the deposition rate is preferably in the range of 1 μm/min to 2 μm/min. The deposition rate may be controlled by controlling the temperature, pressure, temperature of a heat source, and a sample-supplying rate of the substrate.

The thus-manufactured metal porous thin film having a three-dimensional open-network structure has a surface area of 5 $m^2$/g to 200 $m^2$/g, and the porous thin film is characterized in that nanowires or nanoparticles are three-dimensionally connected thereby forming micropores in the form of a network. Additionally, the pores of the porous thin film are mesopores which have a diameter of 1.0 nm to 100 nm and have high homogeneity. The thickness of the metal porous thin film having a three-dimensional open-network structure is preferably in the range of 0.1 μm to 500 μm. In the actual application of the present invention, the micropores of the metal porous thin film having a three-dimensional open-network structure may be constituted by simultaneously including both mesopores having a diameter of 1.0 nm to 100 nm and macropores having a diameter of 0.5 μm or higher together, and the characteristic of the co-existence of micro-sized pores and nano-sized pores is a characteristic which is hardly found in generally-formed porous thin films, and the characteristic is the unique characteristic which can be embodied only in the porous thin film manufactured by the thermal evaporation procedure provided in the present invention. The metal porous thin film having a three-dimensional open-network structure may be applied to porous electrodes for batteries or gas detectors as described above.

Figure 2:
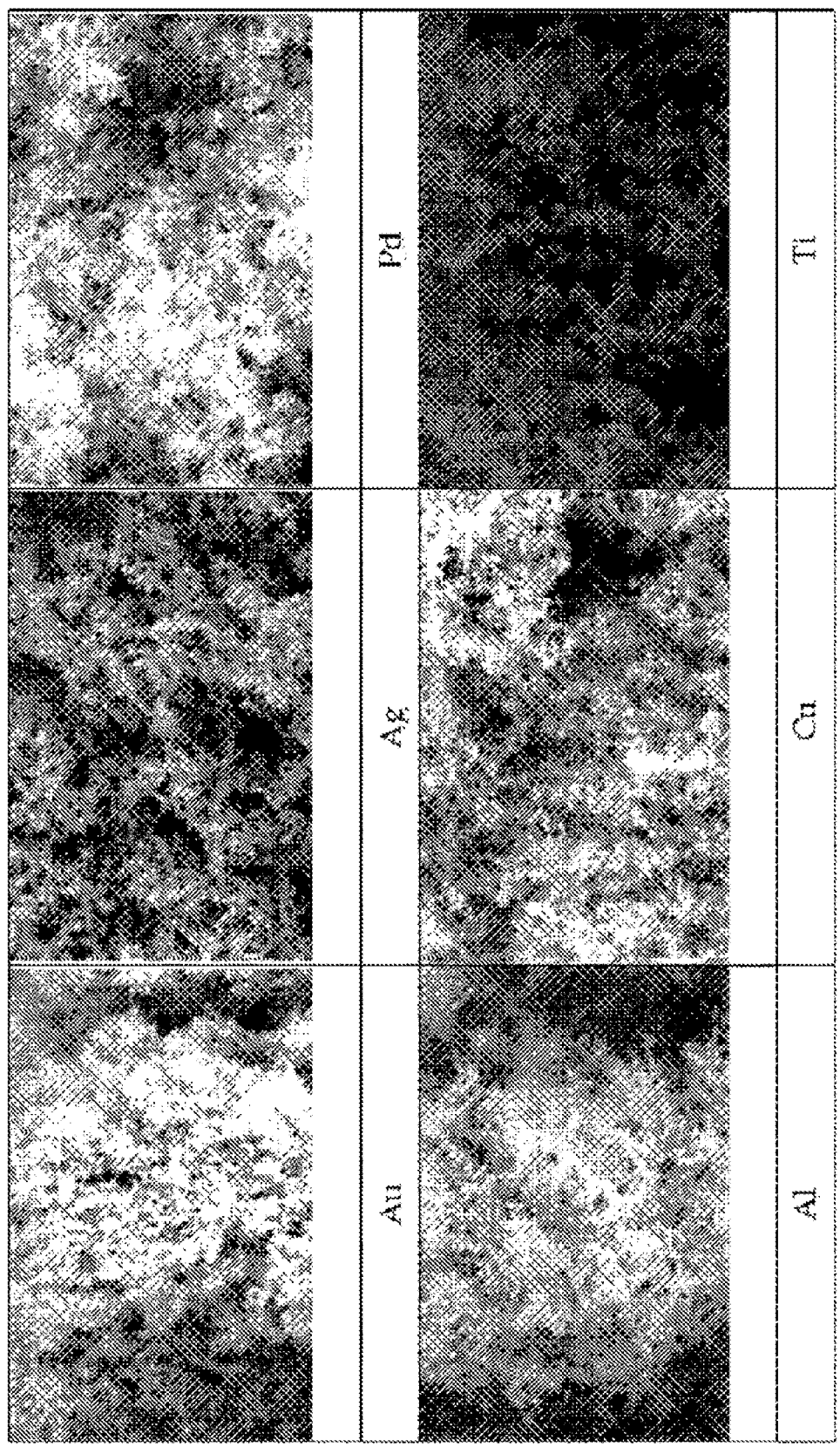
FIG. 2 shows images illustrating the surfaces of various metal porous thin films having a three-dimensional open-network structure of the present invention.

FIG. 2 shows images various metal porous thin films. In the images of FIG. 2, it can be confirmed that the nanowires or nanoparticles consisting of a metal construct a three-dimensional network structure thereby forming pores. Hereinafter, exemplary embodiments of applying Ag as a metal are explained in detail.

<Example—Metal Porous Thin Film>

A Porous Ag Thin Film With a Three-dimensional Open-network Structure

Figure 3:
FIG. 3 shows images illustrating the cross-section of a porous Ag thin film having a three-dimensional open-network structure of the present invention.
Figure 3:
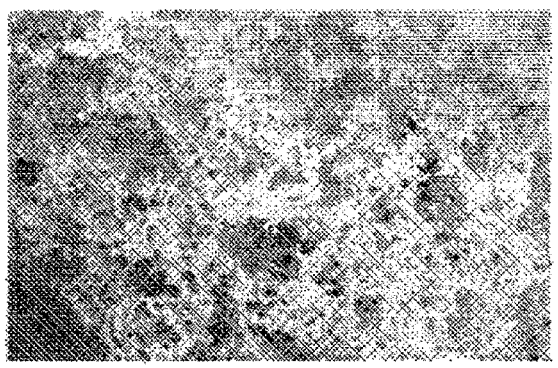
Figure 4:
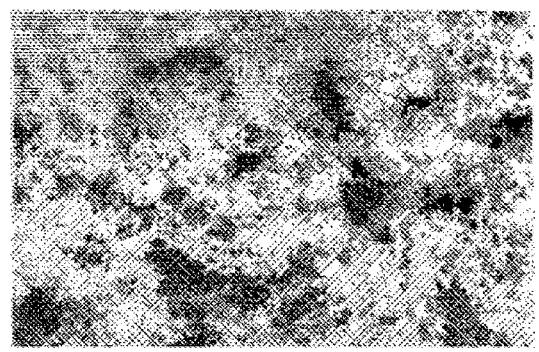
FIG. 4 shows images illustrating the surface of a porous Ag thin film having a three-dimensional open-network structure of the present invention.
Figure 4:
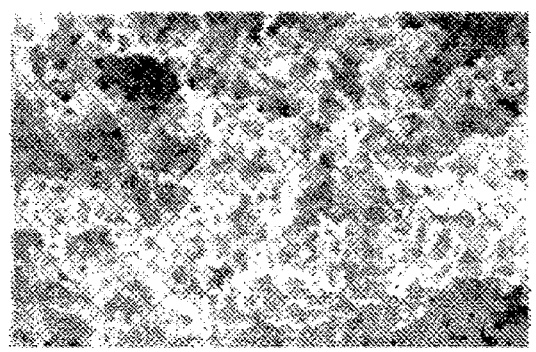

FIG. 3 shows images illustrating the cross-section of a porous Ag thin film having a three-dimensional open-network structure and FIG. 4 shows images illustrating the surface of a porous Ag thin film having a three-dimensional open-network structure of the present invention. According to the present invention, it was possible to form a porous Ag thin film with a three-dimensional open-network structure of about 115 µm by thermal evaporation. In particular, the deposition rate was about 1 µm/min, and the deposition rate may be controlled to a range of 0.1 µm/min to 5 µm/min by controlling the temperature, pressure, temperature of a heat source, and a sample-supplying rate of the substrate. As shown in the images of FIGS. 3 and 4, it can be confirmed that nanowires or nanoparticles are three-dimensionally connected in both cross-sections and surfaces thereby forming pores. In particular, referring to the images of FIGS. 3 and 4, it was confirmed that the pores with a size of 0.5 µm or higher and the nano-sized pores were co-present, and due to the coexistence, the effect of smoothly introducing a reaction gas can be expected.

As described above, the characteristic of the co-existence of micro-sized pores and nano-sized pores is a characteristic which is difficult to find in generally formed porous thin films, and this characteristic is a unique feature that can be embodied in porous thin films manufactured by the thermal evaporation process suggested in the present invention.

Figure 5:
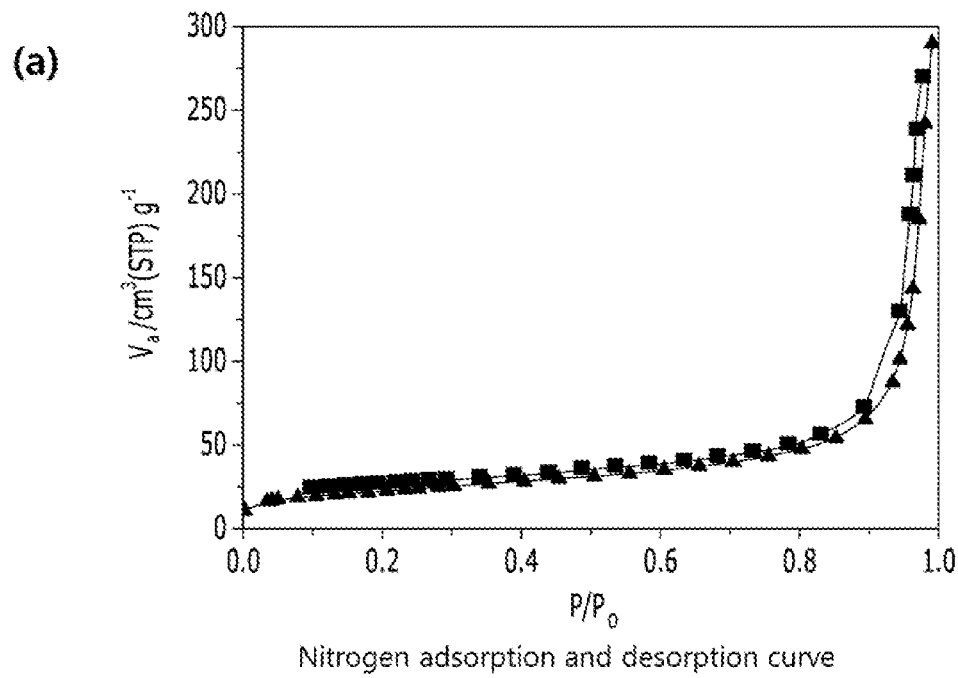
FIG. 5 shows (a) a graph illustrating the surface area by nitrogen adsorption/desorption of a porous Ag thin film having a three-dimensional open-network structure of the present invention, and (b) a graph analyzing the pore size thereof.
Figure 5:
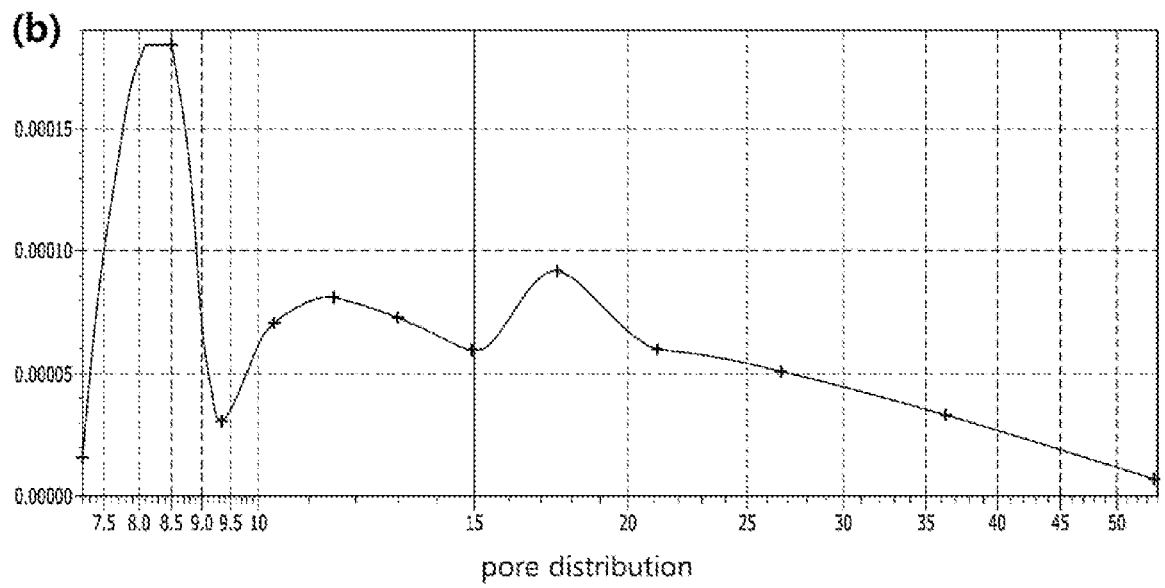

FIGS. 5(a) and 5(b) show graphs illustrating the surface area by nitrogen adsorption/desorption of a porous Ag thin film having a three-dimensional open-network structure of the present invention, and analysis of the pore size thereof. Referring to FIG. 5(a), the adsorption/desorption curve shows the adsorption/desorption characteristic of Type II including macropores. With respect to the degree of pore distribution of FIG. 6, the surface area is about 10.2 m$^2$/g and the pore size is in the range of 1.0 nm to 100 nm thus showing a wide distribution of mesopores.

Figure 6:
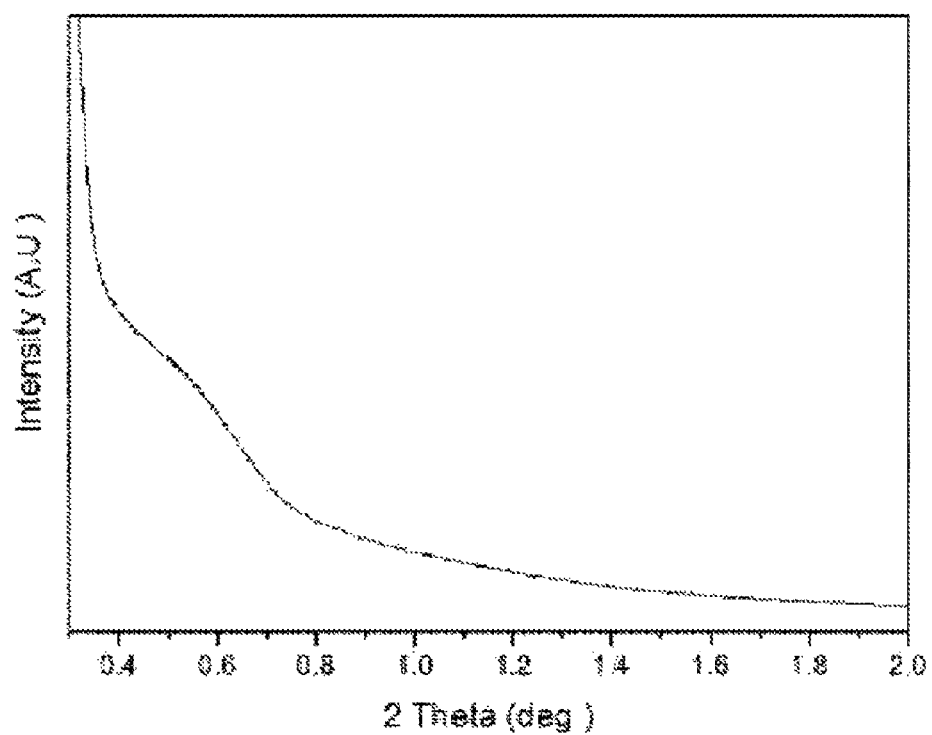
FIG. 6 shows a graph illustrating the result of low angle XRD analysis of a porous Ag thin film having a three-dimensional open-network structure of the present invention.

FIG. 6 shows a graph illustrating the result of low angle XRD analysis of a porous Ag thin film. In confirming the configuration characteristic of pores by the low angle XRD analysis, a slow peak is confirmed at 2θ=0.54° and thus the d-spacing value is 16.3 nm according to the Bragg low (λ=2dsin θ). Accordingly, it can be confirmed that the pores include relatively well-organized mesopores where the distance between faces is 16.3 nm. This is a characteristic which can be hardly found in generally-formed porous thin films, and as described above, this characteristic is a unique characteristic that can be embodied only in the porous thin films manufactured by the thermal evaporation suggested in the present invention.

Figure 7:
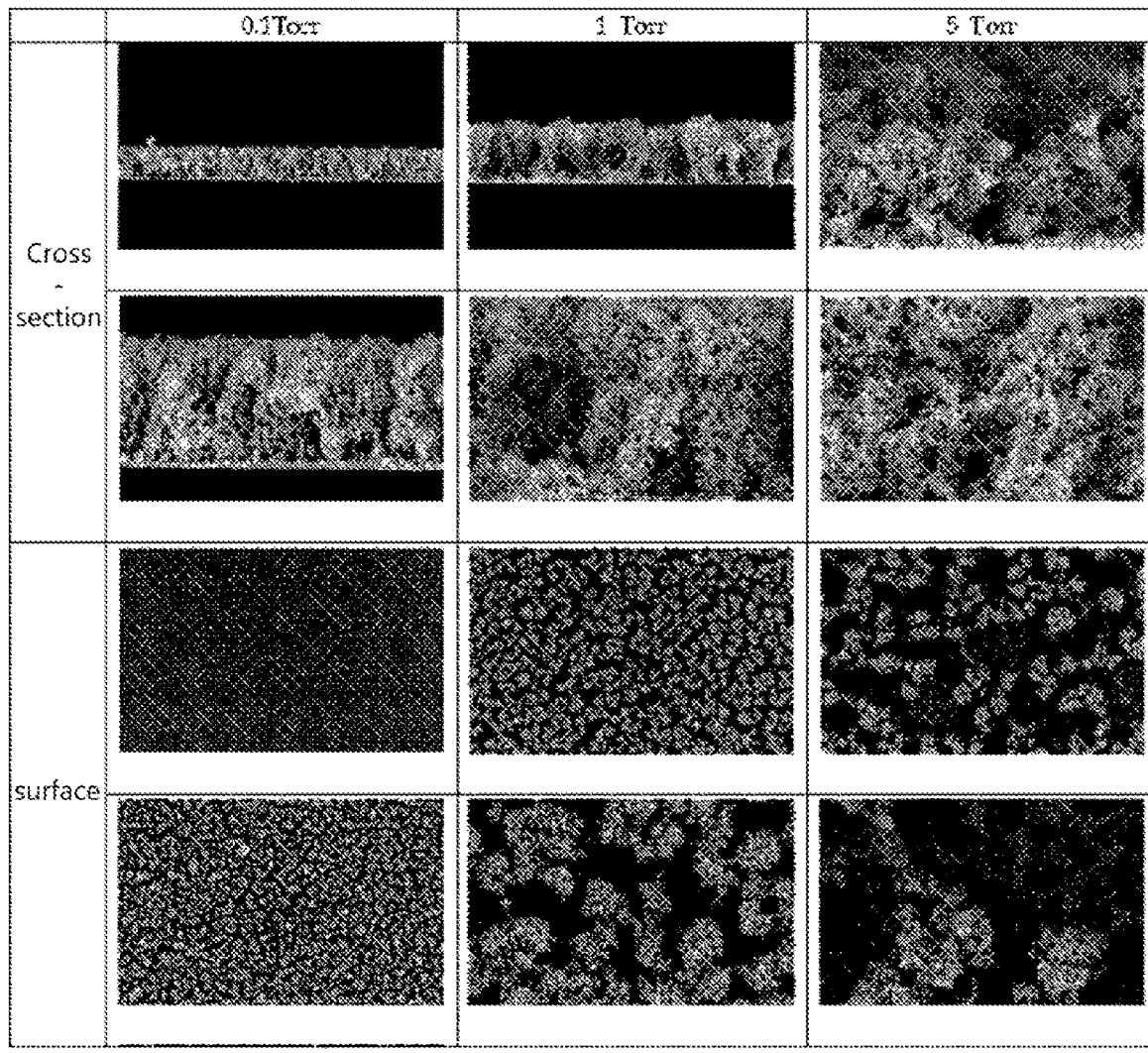
FIG. 7 shows images illustrating the change in the microstructure of a porous Ag thin film having a three-dimensional open-network structure of the present invention, according to pressure.

FIG. 7 shows images illustrating the change in the microstructure of a porous Ag thin film having a three-dimensional open-network structure of the present invention, according to pressure. As described above, it can be confirmed that a three-dimensional nano-network structure can be formed under 0.1 Torr and pores are present but a denser structure compared to the sample manufactured under a higher procedural pressure and also it was confirmed that the amount of pores are relatively less. However, as can be confirmed from the images of FIG. 7, sufficient pores could be obtained under 0.1 Torr and also the pore size became larger.

A Porous Au Thin Film With a Three-dimensional Open-network Structure

Figure 10:
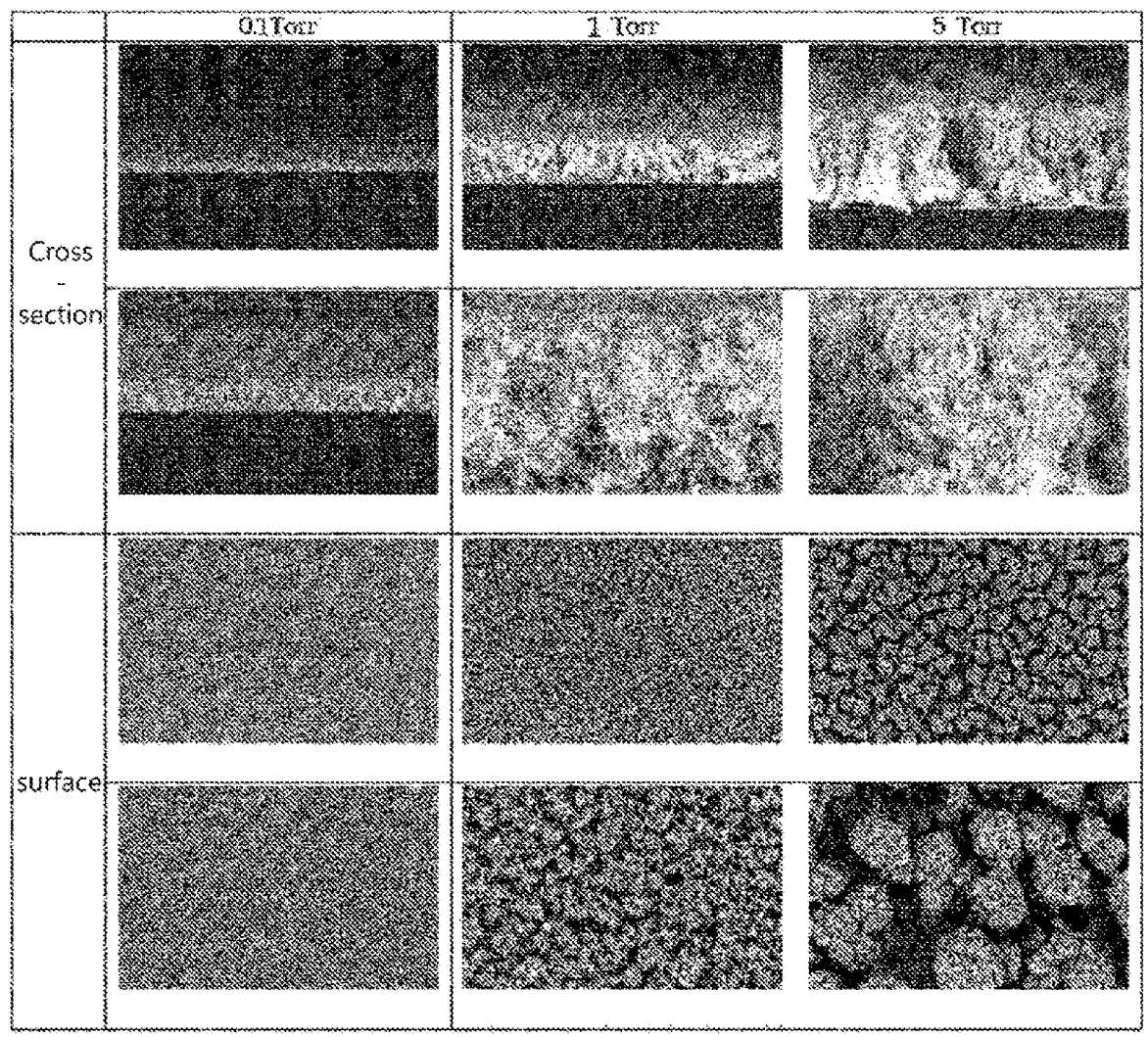
FIG. 10 shows images illustrating the change in the microstructure of a porous Au thin film having a three-dimensional open-network structure of the present invention, according to pressure.

FIG. 10 shows images illustrating the change in the microstructure of a porous Au thin film having a three-dimensional open-network structure of the present invention, according to pressure. As described above, it can be confirmed that a three-dimensional nano-network structure can be formed under 0.1 Torr and pores are present but a denser structure compared to the sample manufactured under a higher procedural pressure and also it was confirmed that the amount of pores are relatively less. However, as can be confirmed from the images of FIG. 7, sufficient pores could be obtained under 0.1 Torr and also the pore size became larger.

These results are similar to those of the porous Ag thin film explained above.

Porous Ag, Pd, Al, Cu, and Ti Thin Films With a Three-dimensional Open-network Structure With respect to Ag, Pd, Al, Cu, and Ti, the procedure was performed after sucking out the vacuum of the chamber out to 1×10$^{-5}$ Torr or less and filling it with Ar and maintain the pressure at 1 Torr. In the cases of all the metals described above, the formed thin films took on colors close to black, and upon observation under SEM, it was confirmed that all of them formed three-dimensional open-network structures, as illustrated in FIG. 2.

Figure 9:
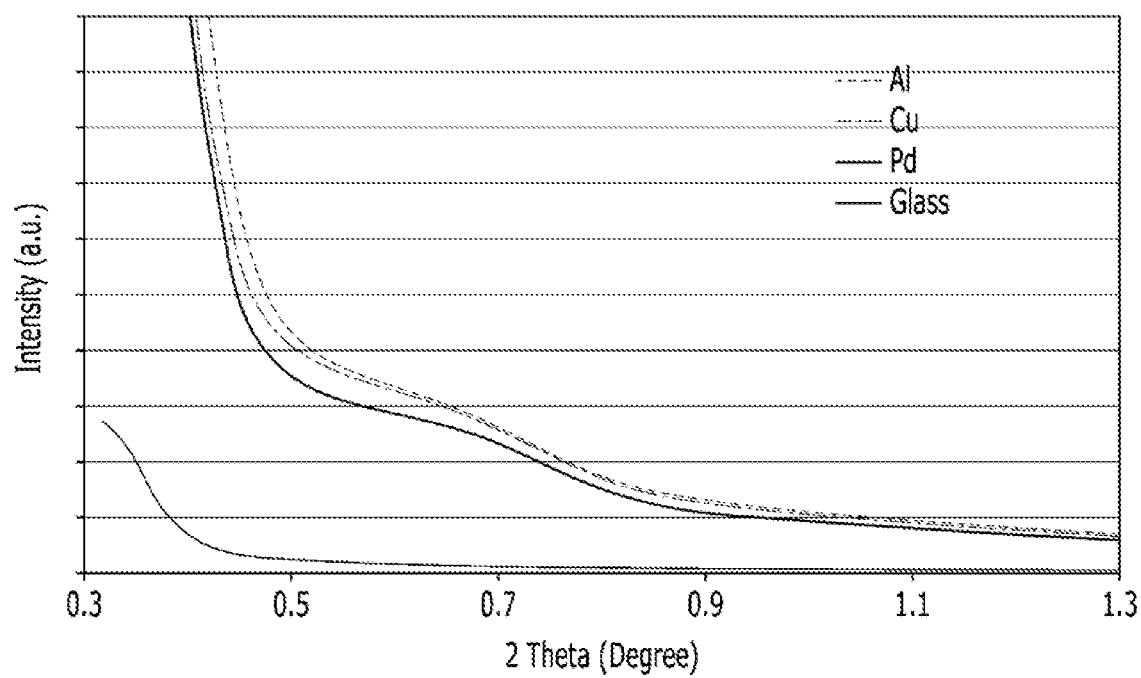
FIG. 9 shows a graph illustrating the results of low angle XRD analysis of Al, Cu, and Pd thin films.

FIG. 9 shows a graph illustrating the results of low angle XRD analysis of Al, Cu, and Pd thin films. As illustrated in the XRD analysis graph, even in the Pd, Al, and Cu thin films, the presence of a slow peak was confirmed at 2θ=0.54° as is the case with Ag, and thus it was confirmed that the pores include relatively well-organized mesopores where the distance between faces is 16.3 nm.

A Sn Thin Film

Figure 8:
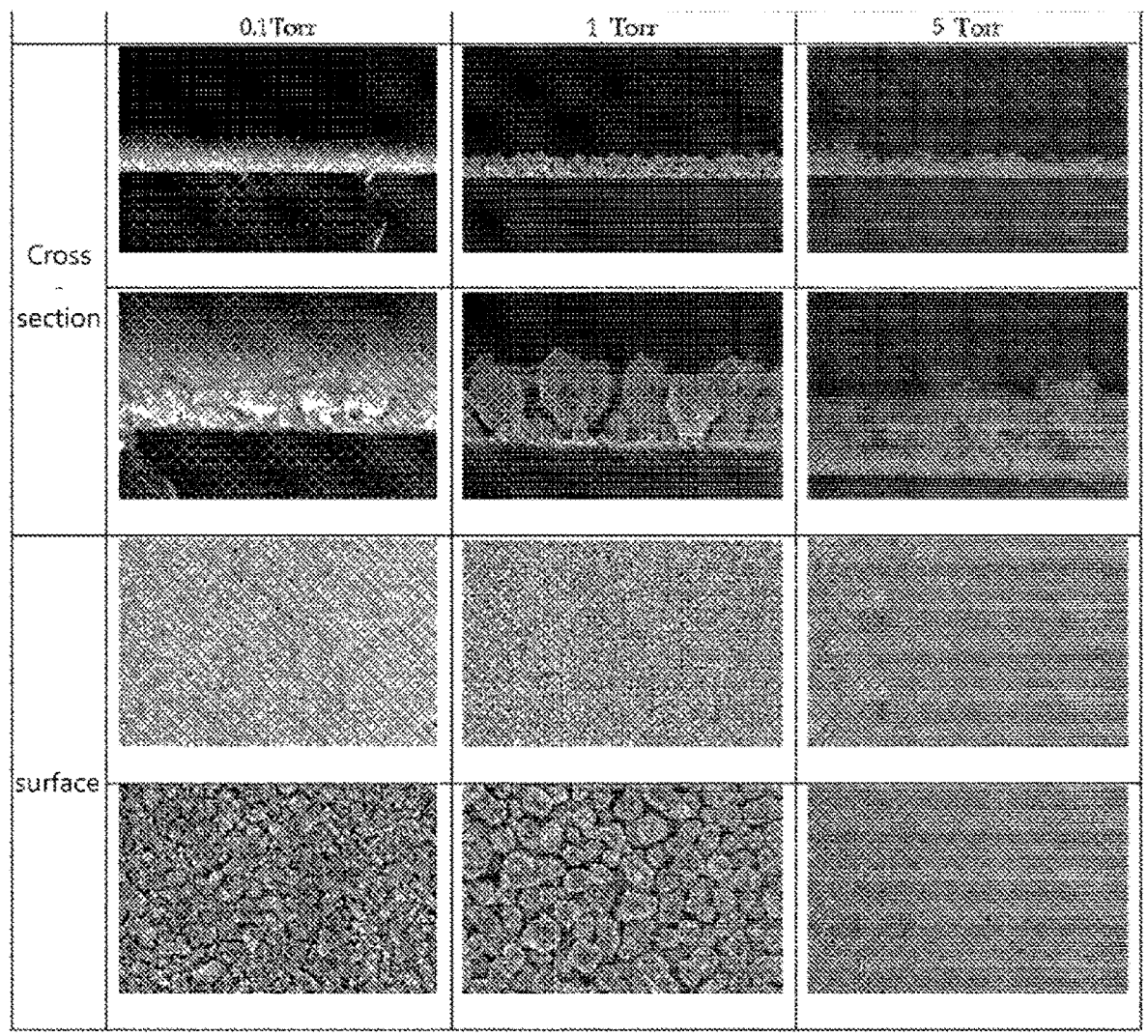
FIG. 8 shows images illustrating the change in the microstructure of a porous Sn thin film according to pressure.

In the case of Sn, deposition was performed under various pressure conditions, but, as illustrated in FIG. 8, the porous thin film with a three-dimensional network structure, which could be obtained in other materials, was not obtained in all conditions. When the pressure was 0.1 Torr, nanoparticles as an assembly formed a thin film but it was not an open structure and also there were many sealed pores. Additionally, when the deposition was performed by increasing the pressure to 1 Torr to 5 Torr, the particles grew to a size of 500 nm in the shape of a leaf or appeared in the form where fairly big particles with a lesser size were in close contact. This is because, as explained above, although the melting point of Sn is 232° C., it should be heated to 1,612° C. to form a vapor pressure of 1 Torr or higher, and thus nanoparticles grew under the atmosphere of significantly high temperature within the chamber.

In the above embodiment, in the case of Ag, a surface area of 10.2 m$^2$/g could be obtained. However, when Mg (1.74 g/cm$^3$) and Al (2.7 g/cm$^3$), which have a lower density than Ag, are applied, high surface area relative to mass can be obtained compared to a case having the same amount of pores. That is, for the maximization of non-specific surface area, it is preferable to apply a metal with a lower density. Additionally, in the case of controlling the porosity and the size of nanoparticles/nanowires, it is possible to increase the non-specific surface area by 2 to 5 folds compare to the above case.

TABLE 1

| Metal | Density (g/cm³) | Metal | Density (g/cm³) |
|---|---|---|---|
| Au | 19.3 | Mg | 1.74 |
| Al | 2.7 | Mn | 7.2 |
| Cr | 7.2 | Mo | 10.2 |
| Co | 8.9 | Ni | 8.9 |
| Cu | 8.9 | Pd | 12.4 |
| In | 7.3 | Pt | 21.5 |
| Fe | 7.86 | Si | 2.42 |
| Pb | 11.3 | Ag | 10.5 |
| Li | 0.53 | Ta | 16.6 |
| Sn | 10.75 | Ti | 4.5 |

<Metal Oxide Porous Thin Film>

In a metal porous thin film having a three-dimensional open-network structure for a gas sensor, a biosensor, a battery-capacitor, a fuel cell, a solar cell, a chemical catalyst, an antibacterial filter, etc., the present invention provides a metal oxide porous thin film having a three-dimensional open-network structure, in which the film has a network structure where nanowires or nanoparticles which are comprised of metal oxides are three-dimensionally connected, and includes mesopores having a diameter of 1.0 nm to 100 nm; and the porous electrode is deposited at the deposition rate of 0.2 µm/min to 5 µm/min, so as to form a three-dimensional open-network porous structure and control the pore structure by controlling the energy of an evaporated metal or metal oxide vapor when they arrive at a substrate in an oxide state.

The pore size may simultaneously include both the mesopores with a diameter of 1.0 nm to 100 nm and macropores having a diameter of 0.5 µm or higher. The characteristic of the co-existence of micro-sized pores and nano-sized pores is a characteristic which is hardly found in generally-formed porous thin films, and the characteristic is the unique characteristic which can be embodied only in the porous thin film having a three-dimensional open-network structure manufactured by the thermal evaporation procedure provided in the present invention. The metal oxide is preferably at least one selected from the oxides of Sn, Ni, Cu, Ti, V, Cr, Mn, Fe, Co, Zn, Mo, W, Ag, Au, Pt, Ir, Ru, Li, Al, Sb, Bi, Mg, Si, In, and Pd.

Figure 11:
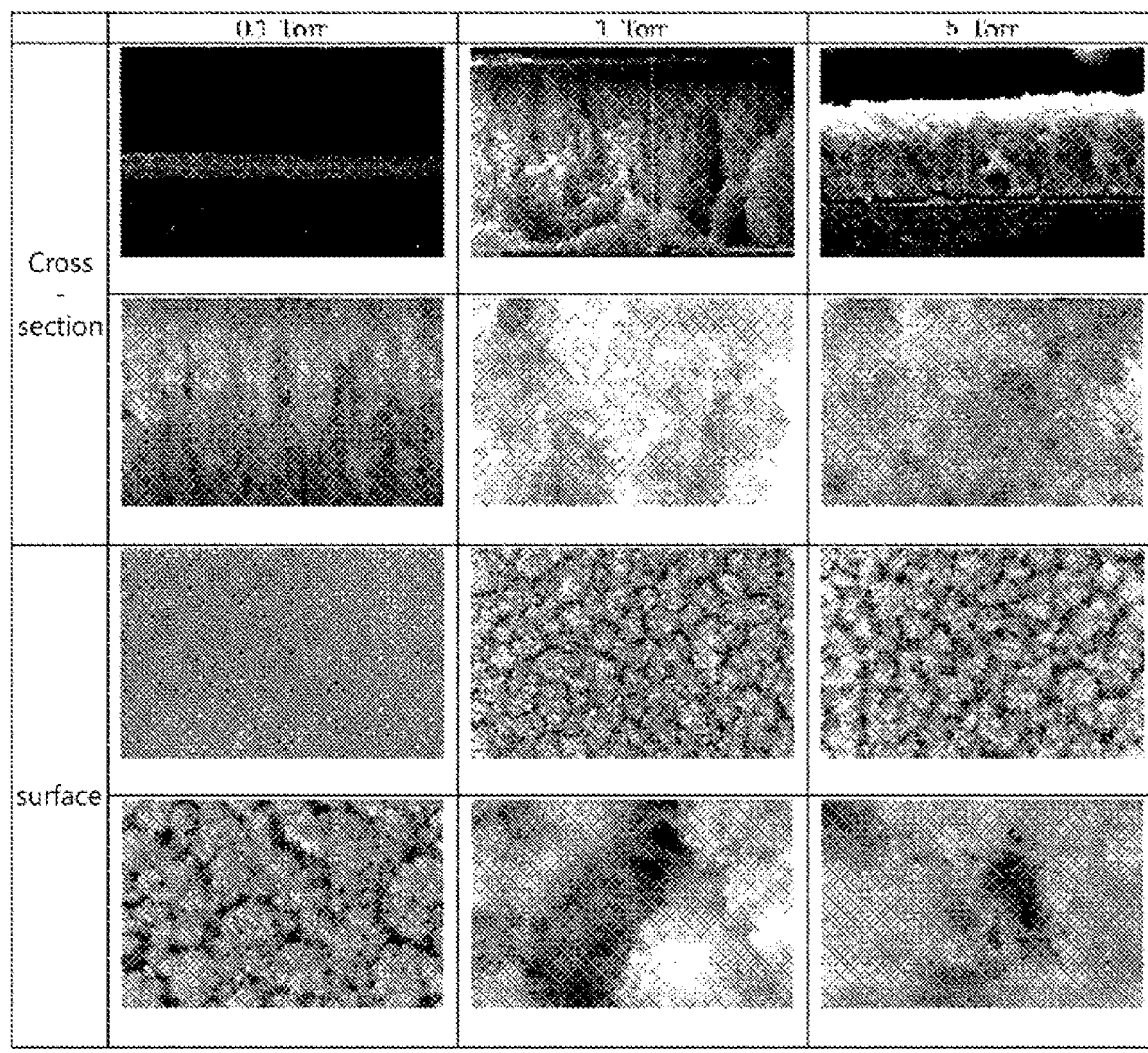
FIG. 11 shows images of cross-sections and surfaces of a metal oxide porous thin film having a three-dimensional open-network structure of a tin oxide according to pressures, according to an exemplary embodiment of the present invention.

FIG. 11 shows images of cross-sections of a metal oxide porous thin film having a three-dimensional open-network structure of a tin oxide according to pressures, as an exemplary embodiment of the present invention. In the images of FIG. 11, it can be confirmed that nano oxide particles constitute wires and form a three-dimensional network structure thereby forming pores. That is, the present invention is characterized by forming a thin film, which has a structure in the form of a network in which nanowires or nanoparticles which are comprised of metal oxides are three-dimensionally connected, has an open structure in which the formed pores are connected to the outside, and a porous structure by a dry surface treatment method.

Hereinafter, exemplary embodiments of the cases where tin oxide, indium oxide, and titanium oxide are applied as a metal oxide are explained in detail.

Figure 13:
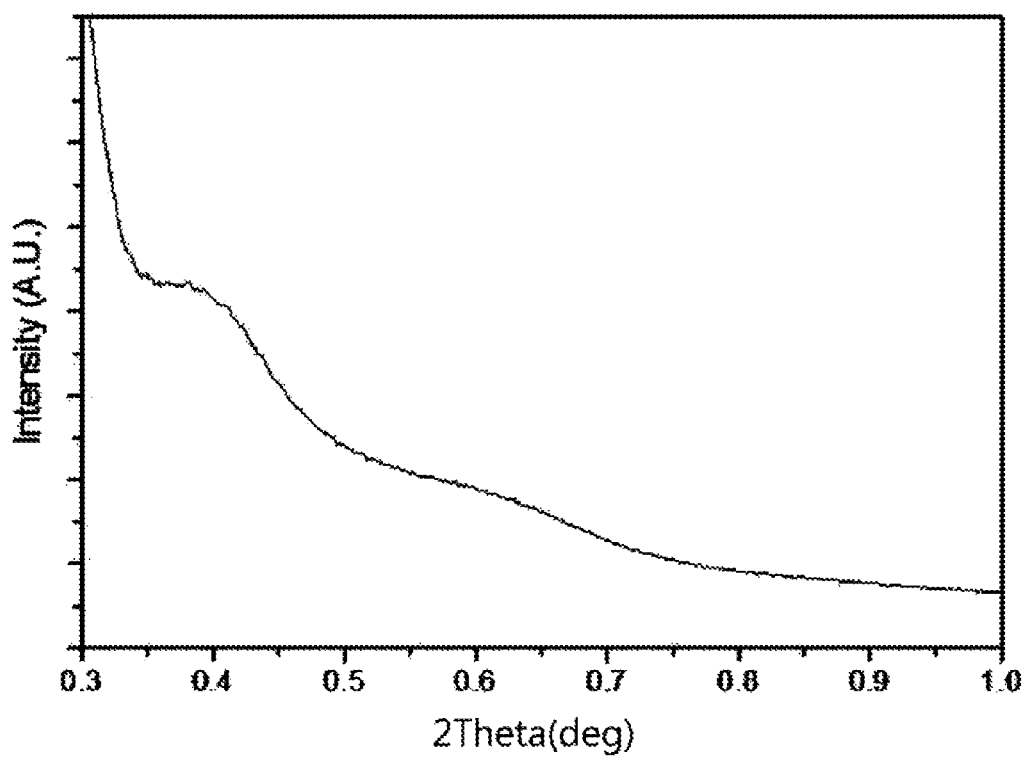
FIG. 13 shows a graph illustrating the results of low angle XRD analysis of a metal oxide porous thin film having a three-dimensional open-network structure of a tin oxide thin film.
Figure 14:
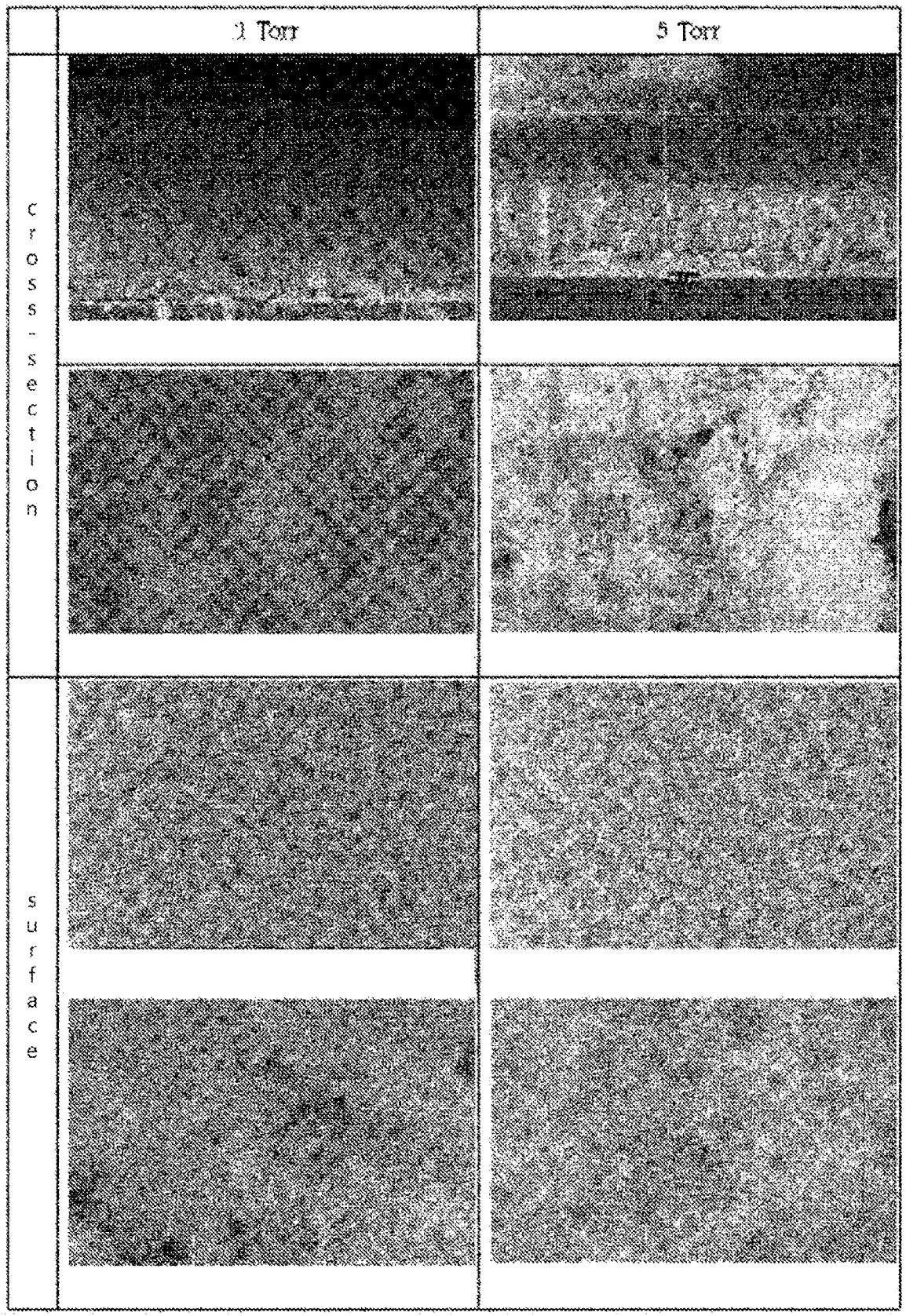
FIG. 14 shows images of surfaces and cross-sections of a metal oxide porous thin film having a three-dimensional open-network structure of an indium oxide according to pressures, according to an exemplary embodiment of the present invention.

<Example —Metal Oxide Porous Thin Films>
A Metal Oxide Porous Thin Film Having a Three-dimensional Open-network Structure, Tin Oxide Thin Film FIG. 11 shows images of cross-sections of a metal oxide porous thin film having a three-dimensional open-network structure of a tin oxide according to pressures, according to an exemplary embodiment of the present invention; FIG. 14 shows images of cross-sections of a metal oxide porous thin film having a three-dimensional open-network structure of an indium oxide, in which deposition was performed under the pressure of 3 Torr to a thickness of 200 µm; and FIG. 14 shows images of surfaces of a metal oxide porous thin film having a three-dimensional open-network structure of an indium oxide, in which deposition was performed under the pressure of 3 Torr to a thickness of 200 µm. According to the present invention, a metal oxide porous thin film having a three-dimensional open-network structure with a thickness of 200 µm was formed by thermal evaporation. In particular, the deposition rate was about 2 µm/min, and was able to control to a rate of 0.2 µm/min to 5 µm/min by controlling the temperature, pressure, temperature of a heat source, and a sample-supplying rate of the substrate. As shown in FIGS. 13 and 14, it was confirmed that all of the nanowires were three-dimensionally connected in both cross-sections and surfaces thereby forming pores in a network structure. In particular, referring to the images of FIGS. 11, 13, and 14, it was confirmed that the pores with a size of 0.5 µAm or higher and the nano-sized pores were co-present, and due to their coexistence, the effect of smoothly introducing a reaction gas can be expected.

As illustrated in FIG. 11, a three-dimensional nano network structure was formed and pores were present under 0.1 Torr but the amount of pores was significantly reduced compared to the sample deposited under 1 Torr or 5 Torr and also the pore size became smaller. However, under the pressure higher than the above, sufficient pores can be obtained thereby being capable of securing a large surface area.

The characteristic of the co-existence of micro-sized pores and nano-sized pores is a characteristic which is hardly found in generally-formed porous thin films, and the characteristic is the unique characteristic which can be embodied only in the porous thin film having a three-dimensional open-network structuremanufactured by the thermal evaporation procedure provided in the present invention. These regular mesopore nano structures can be advantageously used in materials relating to adsorption and reactions of gases such as gas sensors, environmental filters, catalysts, etc.

Figure 12:
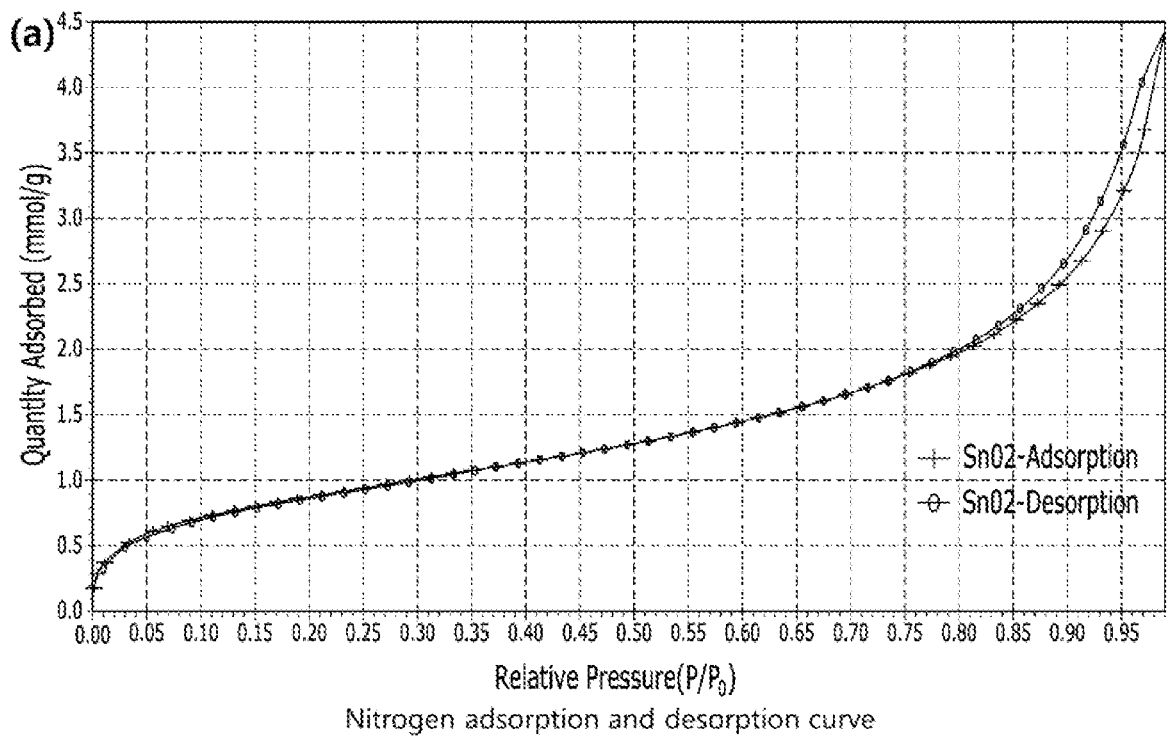
FIG. 12 shows (a) a nitrogen adsorption/desorption curve of a metal oxide porous thin film having a three-dimensional open-network structure of a tin oxide thin film and (b) a graph analyzing the pore size thereof.
Figure 12:
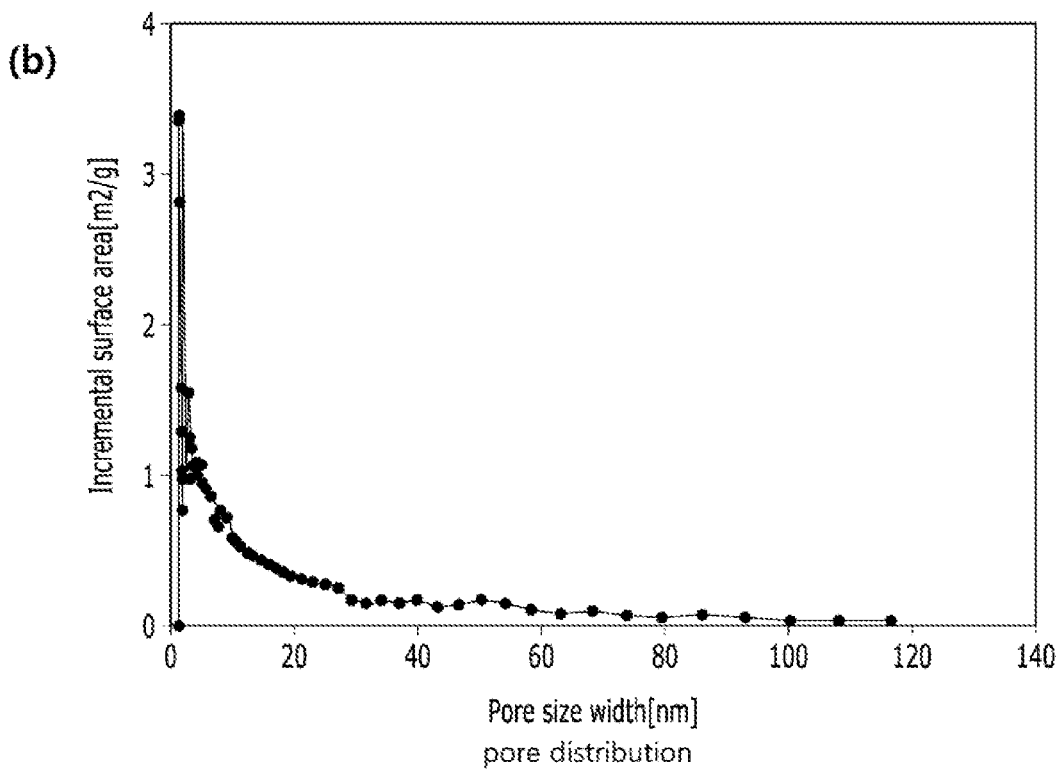

FIGS. 12(a) and 12(b) show a nitrogen adsorption/desorption curve of a metal oxide porous thin film having a three-dimensional open-network structure of a tin oxide thin film and a graph analyzing the pore size thereof. In FIG. 12, the nitrogen adsorption/desorption curve (FIG. 12(a)) shows the characteristic of Type II including macropores, and the degree of pore distribution shows that the broad distribution of mesopores, in which the surface area is about 72.2 m²/g and the pore size is in the range of 1.0 nm to 100 nm.

The non-specific surface area of the tin oxide obtained above was shown to be higher than the non-specific surface area of the commercial nanoparticles (18 nm) of tin oxide (Aldrich), which is about 47.2 m²/g, the non-specific surface area of the commercial nanoparticles (34 nm) of tin oxide (Yamanaka), which is about 25.9 m²/g, and the non-specific surface area of the commercial nanoparticles (34 nm) of tin oxide (C. I. Kasei), which is about 23.0 m²/g.

FIG. 13 shows a graph illustrating the low angle XRD analysis of a metal oxide porous thin film having a three-dimensional open-network structure. In confirming the configuration characteristic of pores by the low angle XRD analysis, slow peaks are confirmed at 2θ=0.38° and 0.62° and thus the d-spacing values are 23.2 nm and 14.2 nm according to the Bragg low (λ=2dsin θ). Accordingly, it can be confirmed that the pores include relatively well-organized mesopores where the distance between faces are 23.2 nm and 14.2. This is a characteristic which can be hardly found in generally-formed porous thin films, and as described above, this characteristic is a unique characteristic that can be embodied only in the porous thin films having a three-dimensional open-network structure manufactured by the thermal evaporation suggested in the present invention.

Indium Oxide

FIG. 14 shows images of surfaces and cross-sections of a metal oxide porous thin film having a three-dimensional open-network structure of an indium oxide according to pressures, as an exemplary embodiment of the present invention. It was also confirmed that indium oxide had a relatively denser structure under 0.1 Torr compared to the sample in which the procedure was performed at a high pressure, and sufficient pores were able to obtain at a pressure higher than the above pressure. Additionally, it was confirmed that the mesopores with a size of 1 nm to 100 nm and the pores with a size of 0.5 μm or higher are co-present at a pressure of 1 Torr or higher, and the non-specific area can be maximized by utilizing such a structure while facilitating the smooth movement of a gas.

Titanium Oxide

Figure 15:
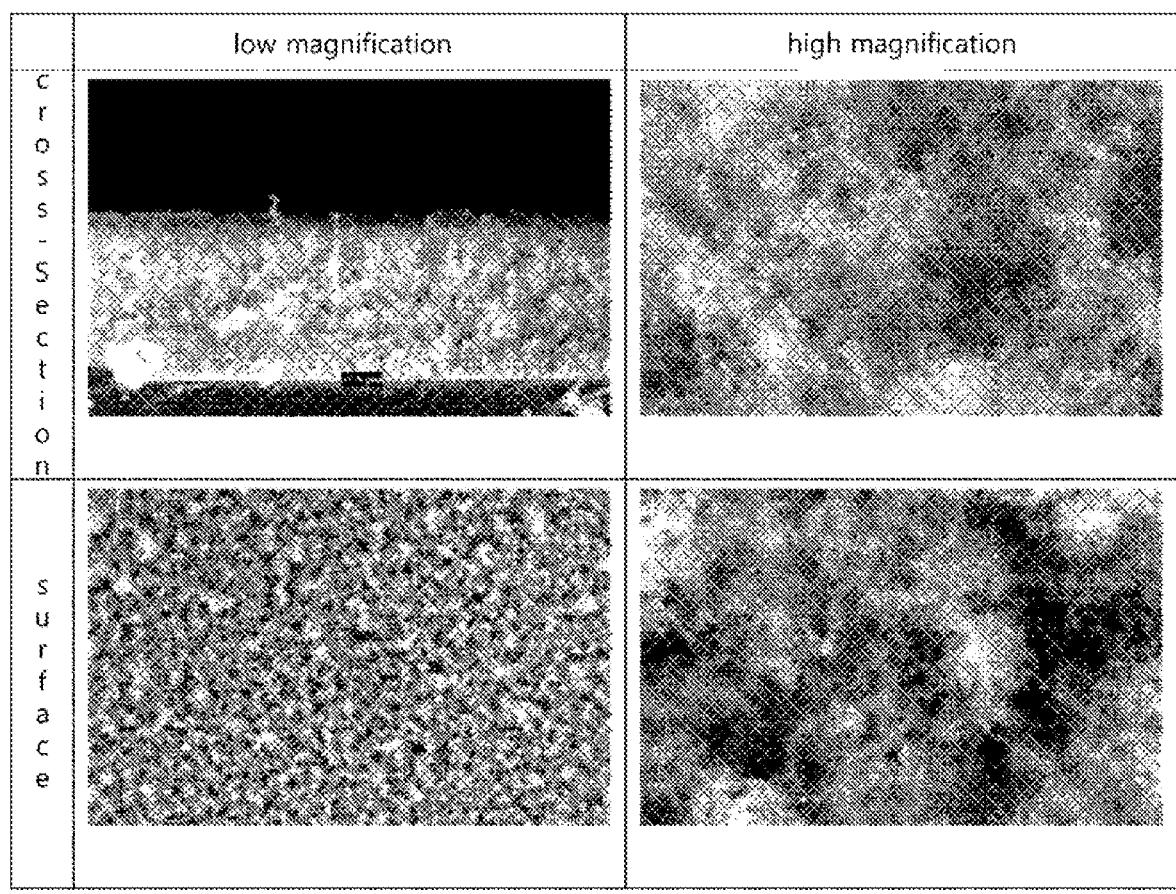
FIG. 15 shows images of cross-sections and surfaces of a metal oxide porous thin film having a three-dimensional open-network structure of a titanium oxide.
Figure 16:
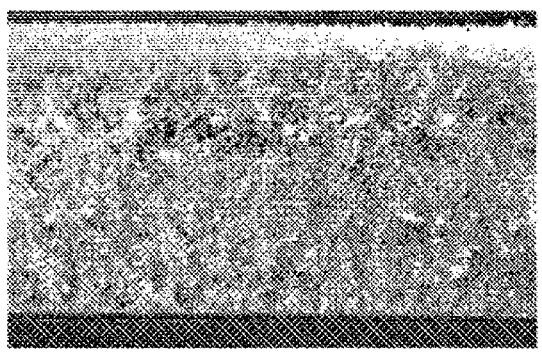
FIG. 16 shows images of cross-sections of a metal oxide porous thin film having a three-dimensional open-network structure of a tin oxide deposited to a thickness of 200 μm.
Figure 16:
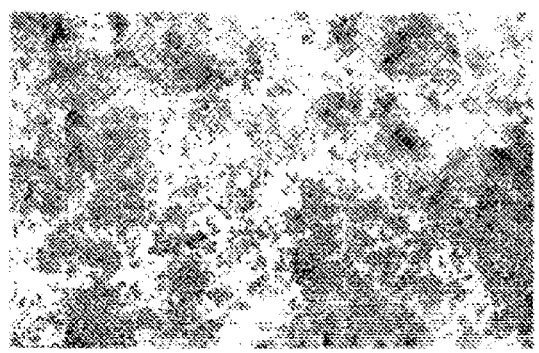
Figure 17:
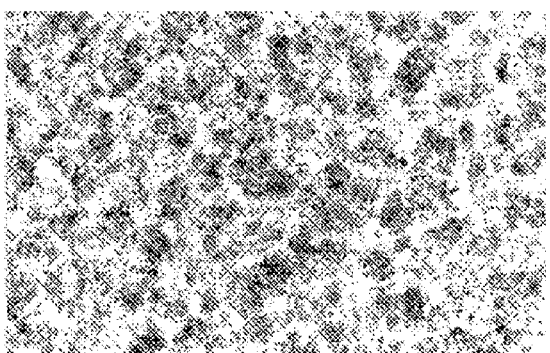
FIG. 17 shows images of the surfaces of a metal oxide porous thin film having a three-dimensional open-network structure of a tin oxide deposited to a thickness of 200 μm.
Figure 17:
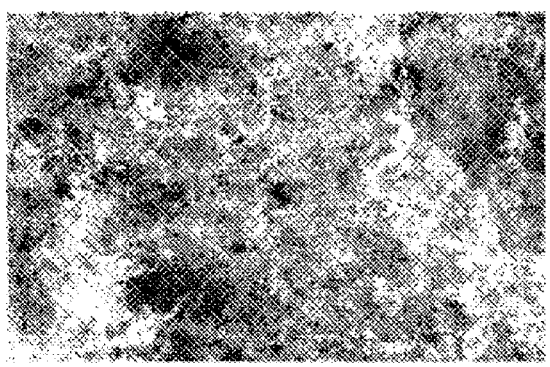

FIG. 15 shows images of cross-sections and surfaces of a metal oxide porous thin film having a three-dimensional open-network structure of a titanium oxide as an exemplary embodiment of the present invention. In the case of a titanium oxide, it was confirmed that the mesopores with a size of 1 nm to 100 nm and the pores with a size of 0.5 μm or higher are co-present at a pressure of 1 Torr or higher, and the non-specific area can be maximized by utilizing such a structure while facilitating the smooth movement of a gas.

Components of a Metal Oxide Porous Thin Film Having a Three-dimensional Open-network Structure The components of the metal oxide porous thin film having a three-dimensional open-network structure manufactured using a tungsten (W) boat in Example, etc., were analyzed by EDS. As a result of the analysis, cases where W, not the deposited material, was detected occurred, and it is speculated that this was because W oxide, which is more readily oxidized compared to W, was deposited as the W boat was oxidized at an oxygen atmosphere. This phenomenon may occur when oxygen is used as a reaction gas or the procedural temperature is high while performing the procedure using W, Ta, and Mo, which are frequently used as an evaporation source in the form of a boat or wire, as a boat of a heat source.

TABLE 2

| Category | Composition (at. %) | | | |
|---|---|---|---|---|
| | Sn or In | O | W | Total |
| Titanium Oxide (0.5 Torr) | 24.06 | 72.38 | 3.56 | 100 |
| Titanium Oxide (1.0 Torr) | 27.97 | 70.19 | 1.84 | 100 |

TABLE 2-continued

| Category | Composition (at. %) | | | |
|---|---|---|---|---|
| | Sn or In | O | W | Total |
| Titanium Oxide (5.0 Torr) | 34.55 | 62.63 | 2.82 | 100 |
| Indium Oxide (0.5 Torr) | 11.60 | 79.90 | 8.50 | 100 |
| Indium Oxide (1.0 Torr) | 13.74 | 79.40 | 6.86 | 100 |
| Vanadium Oxide (1.0 Torr) | 6.69 | 84.92 | 8.39 | 100 |

As examined in exemplary embodiments above, in the method for manufacturing a metal oxide porous thin film having a three-dimensional open-network structure, the present invention provides a method for manufacturing a metal oxide porous thin film having a three-dimensional open-network structure by controlling its pore size in a dry process, wherein the method of manufacturing a metal porous thin film having a three-dimensional open-network structure includes: fixing a substrate 200 to a metal oxide porous thin film having a three-dimensional open-network structure deposition chamber 100 and providing a vacuum state (s1000); injecting an inert gas into the chamber 100 in a vacuum state and providing a constant pressure therein (s2000); setting the temperature of the substrate at 50° C. or below (s3000); increasing the temperature of an evaporation source, in which a metal or metal oxide sample is contained, thereby forming a metal or metal oxide vapor as a thermal evaporation process (s4000); and reacting the evaporated metal or metal oxide vapor when oxygen is present in the chamber, whereas depositing the evaporated metal vapor on top of the substrate in an oxide state without reacting when oxygen is absent (s5000); in which , in step (s2000) for injecting an inert gas into the chamber in a vacuum state and providing a constant pressure therein, the oxygen is able replace part or the entirety of the inert gas; for controlling the pore structure by controlling the energy of the evaporated metal or metal oxide vapor, the pressure in step (s2000) for providing a constant pressure by injecting an inert gas into the chamber in a vacuum state is controlled in the range of 0.1 Torr to 10 Torr; and in which, in step (s5000), where the evaporated metal or metal oxide vapor is reacted when oxygen is present in the chamber, whereas the evaporated metal vapor is not reacted but deposited on top of the substrate in an oxide state when oxygen is absent, the temperature of the substrate is maintained at the same temperature with a temperature deviation of ±5° C. within the temperature of 50° C. or below; and in which, in step (s5000), where the evaporated metal or metal oxide vapor is reacted when oxygen is present in the chamber, whereas the evaporated metal vapor is not reacted but deposited on top of the substrate in an oxide state when oxygen is absent, the deposition rate is in the range of 0.2 μm/min to 5 μm/min.

The pressure in step (s2000) for providing a constant pressure by injecting an inert gas and oxygen into the chamber in a vacuum state for the stability of the oxidized state of a metal oxide and controlling the deposition rate of the metal oxide is preferably in the range of 0.1 Torr to 10 Torr, and more preferably, in the range of 0.2 Torr to 5 Torr. This is because when the pressure is 0.2 Torr or less it leads to the formation of a dense thin film with less pores, whereas when the pressure is 5 Torr or higher the deposition rate becomes too slow. This can become a cause of a collision between the metal atom being deposited and an inert gas, and in a pressure of 5 Torr or higher, the collision between the metal atom and the inert gas becomes too many thereby significantly deteriorating the deposition rate. In general, with respect to the collision number of the particles, the deposition is expected to be performed without any collision up to 5 cm under a pressure of 1 mTorr. That is, under a pressure of 0.1 Torr or less, the distance that can be proceeded without a collision is 0.05 cm and many collisions will occur before the deposition. The number of collisions determines the tight contact between the deposition material and the substrate, the compactness of the deposited thin film, and deposition rate. In particular, with respect to the ratio between the inert gas and oxygen, 90% to 100% of oxygen is preferably added when the amount of oxygen in the material to be deposited relative to the source material is to be increased; 5% to 10% of oxygen is added when maintenance is required; and 0% to 5% of oxygen is added when the amount of oxygen is to be reduced. Under such oxygen conditions, the stability of the oxidized state of the metal oxide can be secured and this will affect the formation of a more uniform mesopore structure.

While a metal oxide is being deposited there occurs a collision with gas particles, and in this case, an inert gas is introduced into the chamber for minimizing the reactivity. In step (s2000) for injecting the inert gas into the chamber in a vacuum state and providing a constant pressure in the range of 0.1 Torr to 5.0 Torr therein, the inert gas is preferably at least one gas selected from the group consisting of Ar, $N_2$, He, Ne, Kr, Xe, and Rn. The inert gas is not limited to the above gases but any gas may be used without limitation as long as the gas does not react with the metal being applied.

For obtaining a uniform network structure and increasing the deposition rate, it is necessary that the temperature of the substrate be maintained at a low and uniform temperature. Accordingly, in step (s3000) for maintaining the temperature of the substrate at the same temperature, the temperature is preferably maintained at 50° C. or below with a temperature deviation of ±5° C. The temperature deviation is a major factor that has an effect on the porosity and particle size of an electrode whose surface is treated in a dry process, and the smaller the temperature deviation the higher the homogeneity. Therefore, the temperature deviation is preferably in the range of ±5° C., and more preferably ±1° C.

Additionally, as described above, in step (s4000) for increasing the temperature of an evaporation source, in which a metal or metal oxide sample is contained, thereby forming a metal or metal oxide vapor, the metal or metal oxide is preferably at least one selected from the group consisting of metals of Sn, Ni, Cu, Ti, V, Cr, Mn, Fe, Co, Zn, Mo, W, Ag, Au, Pt, Ir, Ru, Li, Al, Sb, Bi, Mg, Si, In, and Pd, and oxides thereof.

Additionally, as described above, in the case when tin oxide was applied, a surface area of 72.2 $m^2/g$ could be obtained. However, when SiO (2.1 $g/cm^3$), $SiO_2$ (2.2 $g/cm^3$ to 2.7$g/cm^3$), and MgO (3.58 $g/cm^3$), which have a lower density than tin oxide (density; 6.95$g/cm^3$), are applied, a high surface area relative to mass can be obtained compared to a case having the same amount of pores. When SiO is applied, a surface area of 238.26 $g/cm^3$, which is about 3.3 folds compared to the case when tin oxide was applied, can be expected. That is, for the maximization of non-specific surface area, it is preferable to apply a metal with a lower density. Additionally, in the case of controlling the porosity and the size of nanoparticles/nanowires, it is possible to increase the non-specific surface area by 2 to 5 folds compare to the above case.

In particular, in the case of a material, where the vapor pressure is not significantly lower than the procedural pressure (0.1 Torr to 10 Torr) at a temperature of about 2,400° C. (a limiting temperature) or below, a metal oxide porous thin film having a three-dimensional open-network structure can be formed in most cases. However, in the case of a material which has a melting temperature significantly lower than the temperature of its evaporation source for increasing the vapor pressure, such as Sn, the particle size becomes large due to the conduction of heat generated in the evaporation source thus making it difficult to form a metal oxide porous thin film having a three-dimensional open-network structure.

In step (s4000) for increasing the temperature of an evaporation source, in which a metal or metal oxide sample is contained, thereby forming a metal or metal oxide vapor, the evaporation source is preferably one selected from the group consisting of a crucible, a coil-type evaporation source, a spiral-type evaporation source using a spiral coil, and a boat-type evaporation source, and various other evaporation sources may be applied as well. Additionally, as described above, the material of the evaporation source is preferably any one selected from W, Mo, and Ta.

In step (s5000), where the evaporated metal or metal oxide vapor is reacted when oxygen is present in the chamber, whereas the evaporated metal vapor is not reacted but deposited on top of the substrate in an oxide state when oxygen is absent, the deposition rate is preferably in the range of 0.2 μm/min to 5 μm/min. In order to secure the economic efficiencies such as the productivity of the dry surface treatment process and manufacturing cost, the deposition rate is preferably in the range of 1 μm/min to 3 μm/min. The deposition rate may be controlled by controlling the temperature, pressure, temperature of a heat source, and a sample-supplying rate of the substrate.

The thus-manufactured metal oxide porous thin film having a three-dimensional open-network structure has a surface area of 30 $m^2/g$ to 600 $m^2/g$, and the metal oxide porous thin film is characterized in that nanowires are three-dimensionally connected thereby forming micropores in the form of a network. Additionally, the pores of the metal oxide porous thin film are mesopores which have a diameter of 1.0 nm to 100 nm and have high homogeneity. The thickness of the metal oxide porous thin film having a three-dimensional open-network structure is preferably in the range of 0.1 μm to 500 μm.

As described above, the metal oxide porous thin film having a three-dimensional open-network structure can be applied to a metal oxide porous thin film having a three-dimensional open-network structure, which is used for a gas sensor, a biosensor, a battery-capacitor, a fuel cell, a solar cell, a chemical catalyst, an antibacterial filter, etc.

Although the present invention has been explained in connection with the accompanying drawings, they are merely exemplary embodiments provided for illustrative purposes among various forms of embodiments including the gist of the present invention so that those skilled in the art can easily practice, and thus it is obvious that the present invention should not be limited to these exemplary embodiments explained above. Accordingly, the scope of the present invention should be interpreted by the appended claims below, and all the technical concepts which are within the equivalent scope of the present invention through modifications, substitutions, replacements, etc., will be included within the claim scope of the present invention unless they depart from the gist of the present invention. Furthermore, it should be understood that some of the features in drawings are exaggerated or reduced than their actual sizes, for more clearly explaining the technical features of the present invention.

What is claimed is:

1. A method for manufacturing a metal porous thin film having a three-dimensional open-network structure by controlling its pore size in a dry process, the method comprising:
   i) fixing a substrate to a metal porous thin film having a three-dimensional open-network structure deposition chamber and providing a vacuum state;
   ii) injecting an inert gas into the chamber in a vacuum state and providing a constant pressure therein;
   iii) setting the temperature of the substrate at 50° C. or below;
   iv) increasing the temperature of an evaporation source, in which a metal sample is contained to a temperature of evaporation or higher, the metal sample thereby forming a metal vapor by a thermal evaporation process; and
   v) depositing the metal vapor on top of the substrate;
   wherein, in step ii), the pressure is controlled in a range of 0.05 Torr to 10 Torr; and
   wherein, in step v), the temperature of the substrate is maintained at the same temperature as that of step iii) with a temperature deviation of ±5° C.; and
   wherein, in step v), the deposition rate is in a range of 0.1 μm/min to 5 μm/min.

2. The method of claim 1, wherein, in step (ii), the inert gas is at least one gas selected from the group consisting of Ar, $N_2$, He, Ne, Kr, Xe, and Rn.

3. The method of claim 1, wherein, in step iv), the metal is at least one selected from the group consisting of Au, Ag, Pd, Al, Cu, Cr, Fe, Mg, Mn, Ni, Ti, Zn, Pb, V, Co, Er, Ca, Ho, Sm, Sc, and Tb.

4. The method of claim 1, wherein, in step iv), the evaporation source is one selected from the group consisting of a crucible, a coil evaporation source, a spiral evaporation source using a spiral coil, and a boat evaporation source.

5. The method of claim 1, wherein the deposition rate is controlled by controlling the temperature, pressure, temperature of a heat source, and a sample-supplying rate of the substrate.

6. The method of claim 1, wherein in step ii), the pressure is controlled in a range of 0.1 Torr to 10 Torr.

7. The method of claim 1, wherein in step ii), the pressure is controlled in a range of 0.2 Torr to 5 Torr.

8. A method for manufacturing a metal oxide porous thin film having a three-dimensional open-network structure by controlling its pore size in a dry process, the method comprising:
   i) fixing a substrate to a metal oxide porous thin film having a three-dimensional open-network structure deposition chamber and providing a vacuum state;
   ii) injecting an inert gas into the chamber in a vacuum state and providing a constant pressure therein;
   iii) setting the temperature of the substrate at 5020 C. or below;
   iv) increasing the temperature of an evaporation source, in which a metal or metal oxide sample is contained to a temperature of evaporation or higher, the metal sample thereby forming a metal or metal oxide vapor by a thermal evaporation process; and
   v) reacting the metal oxide vapor when oxygen is present in the chamber, or depositing the metal vapor on top of the substrate in an oxide state without reacting when oxygen is absent in the chamber;
   wherein, in step ii), the oxygen is able replace part or the entirety of the inert gas;
   wherein, in step ii), the pressure is controlled in a range of 0.1 Torr to 10 Torr; and
   wherein, in step v), the temperature of the substrate is maintained at the same temperature as that of step iii) with a temperature deviation of ±5° C.;
   wherein, in step v), the deposition rate is in the range of 0.2 μm/min to 5 μm/min; and
   the surface area of the metal oxide thin film being deposited is in a range of 30 $m^2$/g to 600 $m^2$/g.

9. The method of claim 8, wherein, in step iv, the metal or metal oxide sample is at least one selected from the group consisting of metals of Sn, Ni, Cu, Ti, V, Cr, Mn, Fe, Co, Zn, Mo, W, Ag, Au, Pt, Ir, Ru, Li, Al, Sb, Bi, Mg, Si, In, Pd, and oxides thereof.

10. The method of claim 8, wherein, in step ii, the inert gas is at least one gas selected from the group consisting of Ar, $N_2$, He, Ne, Kr, Xe, and Rn.

11. The method of claim 8, wherein the deposition rate is controlled by controlling the temperature, pressure, temperature of a heat source, and a sample-supplying rate of the substrate.

12. The method of claim 8, wherein, in step iv, the evaporation source is one selected from the group consisting of a crucible, a coil evaporation source, a spiral evaporation source using a spiral coil, and a boat evaporation source.

13. The method of claim 12, wherein, in step iv), the material of the evaporation source is any one selected from W, Mo, and Ta.

* * * * *